United States Patent
Kim et al.

(10) Patent No.: US 10,748,689 B2
(45) Date of Patent: Aug. 18, 2020

(54) SLIM-TYPE STATOR, SENSORLESS SINGLE-PHASE MOTOR USING SAME, AND COOLING FAN

(71) Applicant: AMOTECH CO., LTD., Incheon (KR)

(72) Inventors: Byung Soo Kim, Anyang-si (KR); Jin Gwan Kim, Chuncheon-si (KR)

(73) Assignee: AMOTECH CO., LTD., Incheon (KR)

(*) Notice: Subject to any disclaimer, the term of this patent is extended or adjusted under 35 U.S.C. 154(b) by 200 days.

(21) Appl. No.: 16/090,841

(22) PCT Filed: Apr. 6, 2017

(86) PCT No.: PCT/KR2017/003764
§ 371 (c)(1),
(2) Date: Oct. 3, 2018

(87) PCT Pub. No.: WO2017/176062
PCT Pub. Date: Oct. 12, 2017

(65) Prior Publication Data
US 2019/0115129 A1    Apr. 18, 2019

(30) Foreign Application Priority Data
Apr. 7, 2016 (KR) .................. 10-2016-0042725

(51) Int. Cl.
*H02K 3/00* (2006.01)
*H01F 5/00* (2006.01)
(Continued)

(52) U.S. Cl.
CPC ........... *H01F 5/003* (2013.01); *H02K 1/2753* (2013.01); *H02K 3/26* (2013.01); *H02K 5/161* (2013.01);
(Continued)

(58) Field of Classification Search
CPC ..... H02K 11/215; H02K 11/225; H02K 11/33
See application file for complete search history.

(56) References Cited

U.S. PATENT DOCUMENTS 8,360,747 B2 * 1/2013 Horng ................ F04D 25/0653
310/156.32
9,667,118 B2 * 5/2017 Kim ...................... H02K 7/063
(Continued)

FOREIGN PATENT DOCUMENTS

JP        08154352        6/1996
JP        11146588        5/1999
(Continued)

OTHER PUBLICATIONS

International Search Report—PCT/KR2017/003764 dated Jul. 10, 2017.

*Primary Examiner* — Alexander Talpalatski
(74) *Attorney, Agent, or Firm* — Cantor Colburn LLP

(57) ABSTRACT

Provided are a slim-type stator using a multilayer printed circuit board (PCB) in which a coil pattern is patterned on an uppermost PCB layer and a sensing coil pattern for detecting a rotor rotation position is integrally formed in a margin of the uppermost PCB layer, to thereby realize sensorless driving simply, and a sensorless single-phase motor using the slim-type stator, and a cooling fan using the sensorless single-phase motor. The slim-type stator includes: a multilayer PCB; a coil pattern patterned on respective PCB layers of the multilayer PCB and connected through throughholes; and a sensing coil pattern formed on an uppermost PCB layer to detect a rotor rotation position, wherein the sensing coil pattern is positioned and set at a position deviated from a magnetic pole interface of a rotor that is positioned and set by a dead point prevention yoke when the rotor is in an initial state.

20 Claims, 14 Drawing Sheets

(51) Int. Cl.
- *H02K 7/14* (2006.01)
- *H02K 11/225* (2016.01)
- *H05K 1/16* (2006.01)
- *H02K 3/26* (2006.01)
- *H02K 11/33* (2016.01)
- *H02K 11/215* (2016.01)
- *H02K 1/27* (2006.01)
- *H02K 5/16* (2006.01)

(52) U.S. Cl.
CPC ............ *H02K 7/14* (2013.01); *H02K 11/215* (2016.01); *H02K 11/225* (2016.01); *H02K 11/33* (2016.01); *H05K 1/16* (2013.01); *H05K 1/165* (2013.01); *H02K 2211/03* (2013.01)

(56) References Cited

U.S. PATENT DOCUMENTS

| | | |
|---|---|---|
| 2010/0316509 A1 | 12/2010 | Horng et al. |
| 2016/0049854 A1* | 2/2016 | Ny .................... H02K 53/00 310/68 B |

FOREIGN PATENT DOCUMENTS

| | | |
|---|---|---|
| JP | 2011125168 | 6/2011 |
| JP | 2012050219 | 3/2012 |
| KR | 19870013976 | 6/1990 |
| KR | 20000044146 | 7/2000 |
| KR | 200296035 | 11/2002 |

\* cited by examiner

FIRST PCB LAYER    SECOND PCB LAYER

THIRD PCB LAYER    FOURTH PCB LAYER

FIRST PCB LAYER   SECOND PCB LAYER

THIRD PCB LAYER   FOURTH PCB LAYER

SLIM-TYPE STATOR, SENSORLESS SINGLE-PHASE MOTOR USING SAME, AND COOLING FAN

TECHNICAL FIELD

The present disclosure relates to a stator of a motor, and more particularly to a slim-type stator using a multilayer printed circuit board (PCB) in which a coil pattern is patterned on an uppermost PCB layer and a sensing coil pattern for detecting a rotor rotation position is integrally formed in a margin of the uppermost PCB layer, to thereby realize a sensorless driving simply, and a sensorless single-phase motor using the slim-type stator, and a cooling fan using the sensorless single-phase motor.

BACKGROUND ART

A small-sized fan motor is reduced in size and a single-phase motor having a single coil is used in consideration of cost burden. In this case, the single coil is wound in a quadrangular or triangular coreless/bobbinless type and mounted on a PCB as disclosed in Korean Registered Utility Model Publication No. 20-0296035 (Patent Document 1).

BLDC motors are synchronous motors with fast dynamic response, low rotor inertia and easy speed control.

When a brushless direct current (BLDC) motor is used as the single-phase motor, a Hall sensor for rotor position detection is required to detect the N-pole and S-pole magnetic poles of the rotor to generate a switching signal of the driving current to the stator coil and the Hall sensor is expensive. Therefore, it is preferable to use a driving circuit using only one Hall sensor.

In this case, in the case that a single Hall sensor is used, the magnetic pole of the Hall sensor is not detected when the Hall sensor is located at the interface of the rotor magnetic pole, and thus the current cannot be supplied to the stator coil. Therefore, there is a dead point at which the starting cannot be performed.

In such a single Hall sensor system, there are a method of using an auxiliary magnet so that a Hall sensor deviates from a magnetic pole interface (i.e., a neutral point) of the rotor by using a magnet for fixation to a stator as a self-starting strategy avoiding a dead point, a method of installing magnetic screws on a coil winding portion, and a method of using a special shape dead point prevention yoke as in Patent Document 1.

In the case of using a Hall sensor for rotor position detection for generating a switching signal of the driving current for the stator coil, the cost increase factor occurs since it is necessary to use an expensive Hall sensor and to mount the additional components for the self-starting. Therefore, there is a demand for a method of generating a rotor position signal while minimizing the cost increase factor without using the Hall sensor.

In addition, various sensorless motor driving methods have been proposed for detecting rotor position signals without using a Hall sensor. In this case, a back electromotive force (EMF) is detected using a neutral point in the case of a three-phase BLDC motor using a three-phase coil, and when a neutral point is not present, a virtual neutral point is configured to indirectly detect a back electromotive force (a back EMF), and compare the detected back electromotive force (EMF) with U, V, and W drive signals to obtain an output similar to the Hall sensor output.

However, in the case of a single-phase motor using a stator made of a single coil, the above-described method cannot be applied.

In the case of the single-phase motor, it is possible to employ a double winding method in which a main coil is wound first and a sensing coil for detecting the rotor position is wound once again and extended from each coil to be connected to the drive circuit. In this case, a back electromotive force (a back EMF) generated from the sensing coil at the time of rotor rotation is detected and the switching element of the motor driving circuit is driven based on the detected signal to determine the rotation direction.

However, such a double winding type stator has a disadvantage that it is difficult to use it because of its complicated structure and complicated winding. In addition, since the stator of the double wiring type uses a core type, it is difficult to realize a slim-type structure.

Meanwhile, fan motors used in electronic appliances such as computers and household appliances such as refrigerators largely employ outer rotor type fan motors that can be made compact in the radial direction and the axial direction in consideration of their installation space.

A conventional outer rotor type fan motor is a radial type motor and includes a motor portion and a fan portion that rotates at an outside of the motor portion by rotation of a rotating shaft of the motor portion.

In the outer rotor type fan motor, since the stator adopts the core type, the height of the motor cannot be reduced. Also, since the diameter of the bearing provided at the center of the stator and supporting the rotating shaft is limited, there is a problem that sufficient oil cannot be contained therein.

Korean Utility Model Application Publication No. 20-1987-0013976 (Patent Document 2) discloses an axial flow fan. In the axial fan disclosed in Patent Document 2, the motor is constituted by an axial type in which the field magnets of the rotary fan and the armature coils face each other. However, since the structure in which the air core type armature coils are disposed in the coil winding portion is employed, there is a problem that the height of the stator cannot be reduced anymore.

In addition, a stator of a fan motor disclosed in Korean Patent Laid-Open Publication No. 10-2000-0044146 (Patent Document 3) includes a stator yoke and a single-phase armature coil stacked on an upper portion of a PCB, and a bearing holder at a center of the PCB in which a pair of ball bearings are built in to support the rotating shaft. However, there is still a problem that the stator cannot be made in the form of a thin film.

Meanwhile, in the single-phase motor of Patent Document 1, the stator coil is composed of three rectilinear portions and three vertexes connecting the three rectilinear portions. Portions opposed to the magnets in the rectilinear portion of the stator coil form a magnetic field necessary for torque generation, but the vertexes serve only to connect the rectilinear portions and do not contribute to torque generation.

Since the conventional triangular stator coil has a small total area of the rectilinear portions of the coil (winding) and the portions where the magnets face when the rotor rotates, the torque for rotating the rotor is small. Finally, the conventional triangular stator coil does not have a coil pattern to effectively generate the torque.

Furthermore, in the case of a small fan, the coil is composed of fine wires in a general coil winding method in which a stator coil is wound on a bobbin, a stator coil is wound in a bobbinless type, or a stator coil is wound on a core. Therefore, when the thickness of the coil is constant in the start line and the end line, there is a problem that the start line and the end line may be broken due to careless handling or vibration during soldering the start line and the end line on the solder land or terminal, or the manual soldering process may be defective.

Meanwhile, when wireless power transmission (particularly, rapid charging) is performed to the terminal, the wireless charger generates a lot of heat in the transmission coil and the electronic component, and the charging efficiency is lowered. Accordingly, there is a need for a small, slim-type cooling fan for preventing temperature rise inside the wireless charger by an air cooling method.

DISCLOSURE

Technical Problem

Accordingly, the present disclosure has been made to solve the above problems, and an object of the present disclosure is to provide a slim-type stator using a multilayer printed circuit board (PCB) in which a coil pattern is formed on a surface PCB layer, and a sensing coil pattern for detecting the rotor position is integrally formed in a margin portion of the surface PCB layer, to thus realize sensorless driving inexpensively and simply, a sensorless single-phase motor using the slim-type stator, and a cooling fan using the sensorless single-phase motor.

It is another object of the present disclosure to provide a slim-type stator in which a rotational force applied to an opposite rotor can be maximally obtained, when configuring the slim-type stator for a single-phase motor by using a multilayer printed circuit board (PCB), wherein coil patterns of respective PCB layers have patterns in which a plurality of rotating direction pattern portions and a plurality of radial direction pattern portions are alternately connected, and the radial direction pattern portions are oriented in a radial direction, a sensorless single-phase motor using the slim-type stator, and a cooling fan using the sensorless single-phase motor.

Another object of the present disclosure is to provide a slim-type cooling fan capable of implementing a dead point prevention yoke function without using a separate dead point prevention yoke by forming bridges corresponding to the number of rotor magnetic poles while forming a wind inlet in a lower case.

Technical Solution

According to a first aspect of the present disclosure, there is provided a slim-type stator comprising: a multilayer printed circuit board (PCB); a coil pattern patterned on respective PCB layers of the multilayer PCB and connected via throughholes; and a sensing coil pattern formed on an uppermost PCB layer of the multilayer PCB to detect a rotor rotation position, wherein the sensing coil pattern is positioned and set at a position deviated from a magnetic pole interface of a rotor that is positioned and set by a dead point prevention yoke when the rotor is in an initial state.

The sensing coil pattern may be disposed at a position deviated by a ¼ magnetic pole width from the interface of the magnetic poles or the center of the magnetic poles.

The dead point prevention yoke may have a polygonal shape having outer peripheral portions of the same number as the number of magnetic poles of the rotor and having a circular inner circumferential surface and may be stacked on a lower portion of the stator.

The slim-type stator for a single-phase motor according to an embodiment may further comprise a motor driving circuit mounted on the lowermost PCB layer of the multilayer PCB and applying a driving current to a stator coil formed by the coil pattern.

In this case, the motor driving circuit includes: a rotor position signal generator for generating a rotor position signal corresponding to the rotor magnetic pole when the sensing coil formed by the sensing coil pattern generates an induced electromotive force corresponding to the magnetic pole of the opposite rotor; and a switching circuit for switching the direction of the driving current applied to the stator coil in correspondence to the rotor position signal generated from the rotor position signal generator in correspondence to the magnetic pole of the opposite rotor.

In addition, the dead point prevention yoke may be implemented using a plurality of bridges formed in correspondence to the number of magnetic poles of the rotor in a case where the stator of the single-phase motor is installed.

The coil pattern includes: inner and outer rotating direction pattern portions disposed along a circumferential direction with an interval between an inner circumference and an outer circumference which are arranged concentrically; and radial direction pattern portions that interconnect the inner rotating direction pattern portion and the outer rotating direction pattern portion which are adjacent to each other and are disposed along the radial direction. The coil pattern is configured so that the inner and outer rotating direction pattern portions and the radial direction pattern portions have a shape in which a plurality of protrusions and a plurality of recesses are repeatedly formed, respectively, and the sensing coil pattern is formed in one of the plurality of recesses of the coil pattern.

The coil pattern and the sensing coil pattern may be spirally patterned to form a plurality of turns, respectively.

The number of the radial direction pattern portions may be set to any one of the same number, half the number, and two-times the number as the number of rotor magnetic poles, and an angle between the adjacent radial direction pattern portions is set to a value of 360°/n (Here, n may be any one of the same number, half the number, and two-times the number as the number of rotor magnetic poles).

In addition, the coil pattern may be patterned in the same shape on each PCB layer, or the coil pattern may be patterned so that a first pattern formed on the odd-numbered PCB layer is different from a second pattern formed on the even-numbered PCB layer, in which the second pattern may have a shape that is obtained by rotating the first pattern from the center thereof by (360°/the number of magnetic poles of the rotor).

The plurality of radial direction pattern portions of the coil pattern are connected in such a manner that a current flows in the same direction, thereby generating a rotational force in the tangential direction to a rotor.

A start portion and an end portion of the coil pattern may be formed wider than the portion forming the coil, and at least one throughhole and a soldering land surrounding the throughhole may be disposed.

According to a second aspect of the present disclosure, there is provided a sensorless single-phase motor including: a rotor having a rotating shaft supported at a center of the rotor and having an N-pole magnet and an S-pole magnet alternately arranged; a bearing rotatably supporting the rotating shaft; a bearing holder for receiving and fixing the bearing; a stator having a penetration opening through which the bearing holder passes and having a coil pattern patterned on respective printed circuit board (PCB) layers of a multilayer PCB and connected via throughholes; a sensing coil pattern formed on an uppermost PCB layer of the multilayer PCB to detect a rotor rotation position; and a dead point prevention yoke for setting the sensing coil pattern to be positioned at a position deviated from a magnet interface of the rotor when the rotor is in an initial state.

According to a third aspect of the present disclosure, there is provided a cooling fan including: a rotor including a rotating shaft supported at a central portion thereof, a plurality of blades formed at an outer peripheral portion thereof, and N-pole magnets and S-pole magnets alternately arranged; a bearing rotatably supporting the rotating shaft; a bearing holder for receiving and fixing the bearing; a lower case for supporting the bearing holder; a stator having a penetration opening through which the bearing holder passes and having a coil pattern patterned on respective printed circuit board (PCB) layers of a multilayer PCB and connected via throughholes; a sensing coil pattern formed on an uppermost PCB layer of the multilayer PCB to detect a rotor rotation position; an upper case disposed opposite to the lower case; and side walls connecting between the upper case and the lower case, wherein the lower case includes a ring portion having, at a center of the ring portion, the penetration opening through which the bearing holder passes; and a plurality of bridges connecting the ring portion and a main body of the lower case, wherein the plurality of bridges are formed in the same number as the number of magnetic poles of the rotor or (the number of magnetic poles of the rotor/2), to have a dead point prevention yoke function.

The coil pattern includes: inner and outer rotating direction pattern portions disposed along a circumferential direction with an interval between an inner circumference and an outer circumference which are arranged concentrically; and radial direction pattern portions that interconnect the inner rotating direction pattern portion and the outer rotating direction pattern portion which are adjacent to each other and are disposed along the radial direction. The rotor may be formed in a ring shape, and the width of the ring may be formed at least larger than the length of the radial direction pattern portion.

Advantageous Effects

As described above, in the present disclosure, a Hall sensor for detecting a rotor position is not used, and in a slim-type stator using a multilayer printed circuit board (PCB), a coil pattern is patterned on a surface PCB layer, and a sensing coil pattern for detecting the rotor position is integrally formed in a margin portion of the surface PCB layer, to thus realize a sensorless motor driving circuit inexpensively and simply.

Further, in the present disclosure, when a slim-type stator for a single-phase motor is constituted by using a multilayer printed circuit board (PCB), a coil pattern of each layer is formed so as to have a star pattern for example in which a plurality of rotating direction pattern portions and radial direction pattern portions are alternately connected, to thereby design the motor so as to maximize the torque generation in the opposite rotor so that the efficiency of the motor can be increased. That is, the radial direction pattern portions are oriented in the radial direction, so that a tangential force is generated when the stator coil is energized, so that an effective torque can be obtained.

In the present disclosure, a stator coil for rotationally driving a rotor is implemented in a thin film form using a conductive pattern coil formed on a multilayer PCB, and a slim-type single-phase motor capable of improving productivity and attaining cost reduction can be realized. Thus, a slim-type cooling fan for various types of electronic devices can be provided by using the slim-type single-phase motor. Particularly, the cooling fan can be applied to a slim-type electronic device such as a wireless charger.

In the present disclosure, a dead point prevention yoke function can be implemented without forming a separate dead point prevention yoke by forming bridges corresponding to the number of rotor magnetic poles while forming a wind inlet in a lower case.

According to the present disclosure, in the slim-type stator, the thicknesses of the coil patterns of each PCB layer are adjusted so that the start portion and the end portion are designed to be wider than the portions forming the coils (winding), for example, in the form of a tear drop, to thereby increase the reliability of connections.

That is, the start portion and the end portion of the coil pattern are formed in the form of a tear drop, and the throughholes and the soldering lands surrounding the throughholes are disposed to interconnect the coil patterns, or ease the connections to the wiring patterns and guarantee the reliability of the connections.

Further, in order to increase the reliability, at least one throughhole connecting the start portion and the end portion to each PCB layer may be formed so as to prevent the reliability from being deteriorated due to the breakage of the wire or the badness of the throughhole.

BEST MODE

Figure 1:
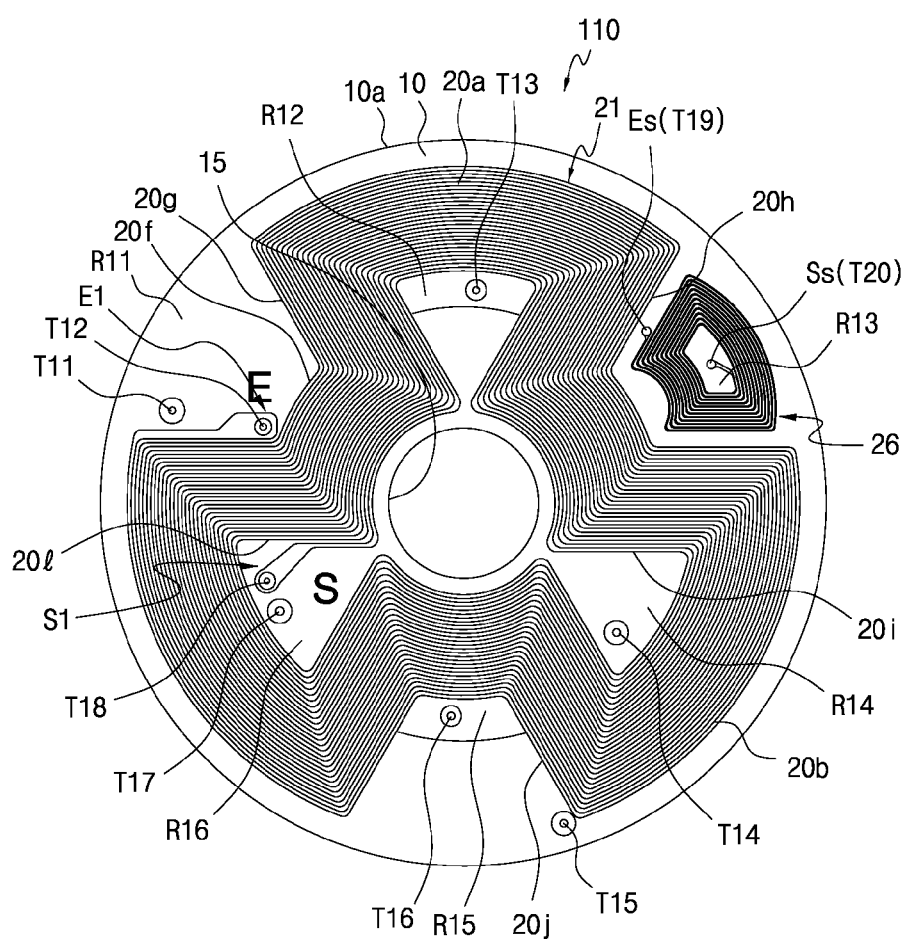
FIG. 1 is a plan view showing a slim-type stator for a sensorless single-phase motor according to the present disclosure.

Hereinafter, embodiments of the present disclosure will be described in detail with reference to the accompanying drawings. The sizes and shapes of the components shown in the drawings may be exaggerated for clarity and convenience.

Referring to FIGS. 1, 2A, 2B and 10, a slim-type stator 110 for a sensorless single-phase motor according to an embodiment of the present disclosure includes: a plurality of substrates 10 formed by stacking a plurality of layers and made of an insulating material; a plurality of coil patterns 21 to 25 each made of a helical conductive pattern obtained by patterning a copper foil laminated on a respective layer substrate so as to form a plurality of turns necessary for constructing a stator coil L1; a sensing coil pattern 26 forming a sensing coil Ls for rotor position detection to implement a sensorless motor drive circuit 30; a plurality of throughholes T11 to T18 plated in penetration openings formed by penetrating through the plurality of substrates 10 to interconnect the plurality of coil patterns 21 to 25; and a pair of throughholes T19 and T20 for connecting the sensing coil pattern 26 to the motor driving circuit 30.

The plurality of coil patterns 21 to 25 include: inner and outer rotating direction pattern portions 20a-20f which are arranged in a circumferential direction at intervals along an inner circumference and an outer circumference; and a plurality of radial direction pattern portions 20g-20l that interconnect the inner rotating direction pattern portion and the outer rotating direction pattern portion that are adjacent to each other and are disposed along the radial direction from a center thereof.

The slim-type stator 110 may be constructed by using a multilayer substrate 10a made of a copper clad laminate (CCL) in which copper foils are stacked on the respective layer substrate 10. The copper foil of each layer substrate is patterned and laminated, thereby forming a conductive throughhole.

The substrates 10 may be made of an insulating resin such as FR-4 or CEM-3 made of a glass epoxy laminate, for example, as a substrate material. A multilayer substrate 10a has a structure in which a copper foil is laminated on the substrate 10 of each layer, and any insulating resin can be used as a material of the substrate as long as the multilayer substrate 10a can constitute a multilayer PCB.

The number of layers of substrates stacked in the slim-type stator 110 can be set within a range of one to ten layers in proportion to a desired round-per-minute (RPM) of a single-phase motor. It is required to increase the number of PCB layers stacked to use the plurality of coil patterns 21 to 25 since a large number of coil turns is required so as to obtain a high torque value, In order to obtain a high RPM.

The lowermost PCB layer in the slim-type stator 110 includes a printed wiring 17 formed to interconnect a coil pattern and an electronic component and various electronic components 16 are mounted on the printed wiring 17, to form a motor driving circuit 30. The printed wiring 17 includes a power supply terminal Vcc and a ground pattern GND to which an external power supply is connected.

The stator 110 for a single-phase motor according to the embodiment of the present disclosure may be constructed using a double-sided substrate on which a copper foil is laminated on both sides of the substrate 10 when a high RPM is not required. In this case, the coil pattern 21 necessary for constructing the stator coil L1 is formed on one surface of the substrate 10 and the motor driving circuit 30 is mounted on the rear surface of the substrate 10.

Figure 2A:
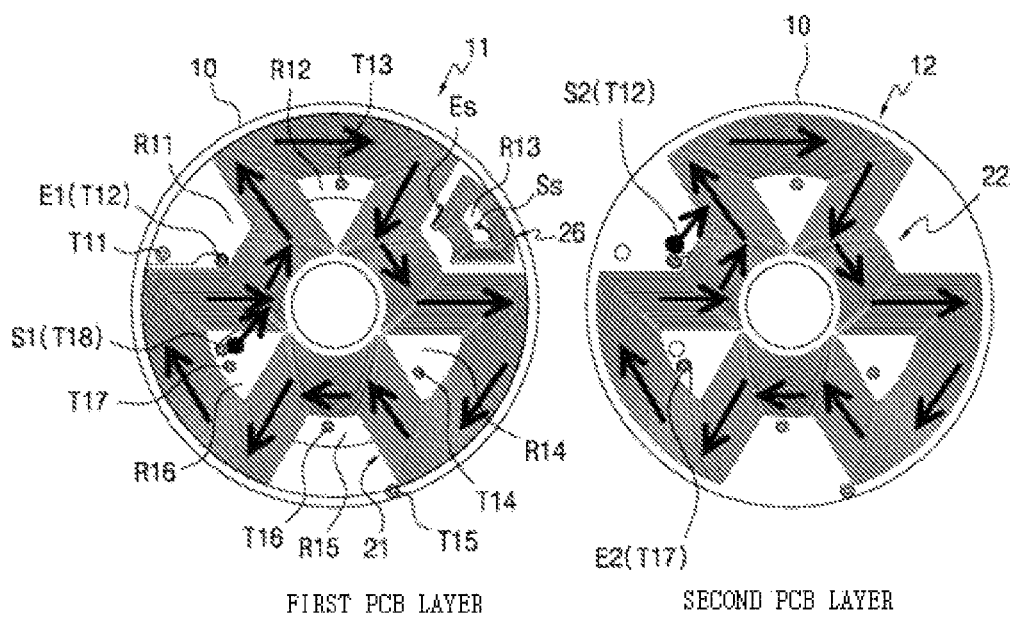
FIGS. 2A and 2B are development views showing coil patterns for respective PCB layers of a slim-type stator for a sensorless single-phase motor according to an embodiment of the present disclosure.
Figure 2B:
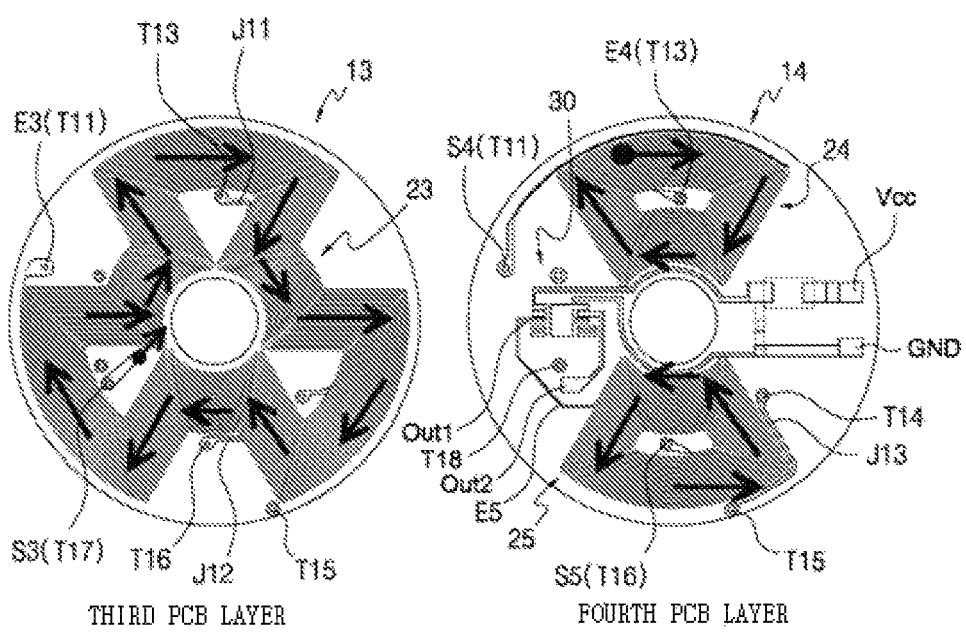

In the following description of the embodiment, it is assumed that the slim-type stator 110 is a multilayer PCB in which first to fourth PCB layers 11 to 14 having a four-layer structure are stacked as shown in FIGS. 2A and 2B.

The first to third PCB layers 11 to 13 are respectively formed with first to third coil patterns 21 to 23 having a star shape, for example, on the upper surface of the substrate 10 and the fourth PCB layer 14 of the lowermost layer is formed with, for example, separate fan-shaped fourth and fifth coil patterns 24 and 25, respectively, and are formed by finely patterning a conductive metal such as a copper (Cu) foil, for example. Each of the PCB layers 11 to 14 may be selected from among those having various thicknesses of, for example, 0.4 mm and 0.8 mm, and the coil patterns 21 to 25 applied to this embodiment are patterned so that, for example, the pattern width is 0.12 mm, and the interval between adjacent patterns is 0.13 mm. The width of the coil pattern and the distance between the patterns can be increased or decreased as needed.

In the embodiment shown in FIGS. 2A and 2B, the slim-type stator 110 is formed such that all of the first to fourth coil patterns 21 to 24 have a helical shape in the clockwise (CW) direction and only the fifth coil pattern 25 has a helical shape in the counterclockwise (CCW) direction.

In this case, the first and third coil patterns 21 and 23 are formed such that the start portions S1 and S3 are disposed on the inner side and the end portions E1 and E3 are disposed on the outer side, while the second and fourth coil patterns 22 are formed such that the start portions S2 is disposed on the outer side and the end portion E2 is disposed on the inner side.

In the illustrated embodiment, the coil patterns 21 to 23 of the first to third PCB layers are all formed to have a helical shape in the CW direction.

However, since the fourth and fifth coil patterns 24 and 25 of the fourth PCB layer 14 are disposed at positions opposed to each other in a line symmetrical structure, the fourth coil pattern 24 has a pattern wound in the CW direction and the fifth coil pattern 25 has a pattern wound in the CCW direction.

The slim-type stator according to this embodiment is characterized in that, when the coil patterns 21 to 23 of all the PCB layers are formed of windings having a helical shape in the clockwise (CW) direction, the first and third coil patterns 21 and 23 of the odd-numbered PCB layers 11 and 13 are provided with start portions S1 and S3 on the inner side and end portions E1 and E3 on the outer side and the second coil pattern 22 of the even-numbered PCB layer 12 is provided with a start portion S2 on the outer side, and an end portion E2 on the inner side.

In the slim-type stator according to this embodiment, after all of the coil patterns 21 to 23 are formed of windings having a helical shape in the CW direction, first and second jumper wire patterns J11 and J12 are formed on the third PCB layer 13 to connect the fourth coil pattern 24 and the fifth coil pattern 25 of the lowermost layer, that is, the fourth PCB layer 14, and a fifth jump pattern J13 is formed on the fourth PB layer 14.

Since the first to third coil patterns 21 to 23 are disposed at the same position in the same shape in the slim-type stator according to the embodiment of the present disclosure, a space in which the throughholes used for interconnecting the coil patterns of the respective PCB layers are arranged can be secured widely.

The rest regions of the first to third coil patterns 21 to 23 except for regions where the fourth coil pattern 24, the fifth coil pattern 25 and the sensing coil pattern 26 overlap, become throughhole regions R11 to R16 in which the throughholes T11 to T20 can be arranged.

In other words, when viewed from the first PCB layer 11 as a reference, portions of the left side recesses and the inner side regions of the upper protrusions of the first to third coil patterns 21 to 23, the inside of the sensing coil pattern 26, and portions of the inner side regions and the recesses of the lower protrusions of the sensing coil pattern 26 corresponds to the throughhole regions R11 to R16.

The eleventh to twentieth throughholes T11 to T20 are disposed in the throughhole regions R11 to R16 and the first to fifth coil patterns 21 to 25 are connected in series by using the first to third jumper wire patterns J11 to J13, to thereby form one stator coil L1.

That is, the first coil pattern 21 of the first PCB layer 11 is wound in the clockwise direction in the start portion S1, and then the end portion E1 is connected to the start portion S2 of the second coil pattern 22 of the second PCB layer 12 via the twelfth throughhole T12, and the end portion E2 of the second coil pattern 22 is connected to the start portion S3 of the third coil pattern 23 of the third PCB layer 13 via the seventeenth throughhole T17.

In addition, the end portion E3 of the third coil pattern 23 is connected to the start portion S4 of the fourth coil pattern 24 of the fourth PCB layer 14 via the eleventh throughhole T11, and the end portion E4 of the fourth coil pattern 24 and the start portion S5 of the fifth coil pattern 25 are interconnected through the first to third jumper wire patterns J11 to J13.

As a result, one end of the stator coil L1, that is, the end portion E5 of the fifth coil pattern 25 is connected to the first output terminal Out1 of the motor driving circuit 30 and the other end of the stator coil L1, that is, the start portion S1 of the first coil pattern 21 is connected to the second output terminal Out2 of the motor driving circuit 30 via the eighteenth throughhole T18.

In the slim-type stator according to the embodiment of the present disclosure, a part of the motor driving circuit 30 mounted on the fourth PCB layer 14 is disposed on the left side and another part of the motor driving circuit 30 is disposed dispersedly on the right side. When a DC power is supplied between the power supply terminal Vcc and the ground pattern GND disposed in the motor driving circuit 30 of the fourth PCB layer 14, the motor driving circuit 30 periodically applies the driving current to the stator coil L1 while changing the current flow direction as described later, and accordingly a rotating magnetic field is generated from the stator coil L1 to rotate the facing rotor.

In the above description, the coil patterns 21 to 23 of the first to third PCB layers 11 to 13 have the same shape, but can be modified in various forms in some embodiments of the present disclosure.

For example, the first and third coil patterns 21 and 23 of the first and third PCB layers 11 and 13 are formed in an identical shape and the second coil pattern 22 of the second PCB layer 12 is formed in the same shape as the first and third coil patterns 21 and 23, but is deviated by a phase difference of 60 degrees. That is, an angle of deviation of an odd-numbered layer coil pattern and an even-numbered layer coil pattern is set at a position rotated around a penetration opening by (360°/the number of magnetic poles of the rotor).

In some embodiments of the present disclosure, even in the case that the odd-numbered layer coil pattern and the even-numbered layer coil pattern are the same as shown in FIGS. 2A and 2B or different from each other as in a modification, the first to third PCB layers 11 to 13 are stacked to then have a structure that the six radial direction pattern portions 20g to 20l are arranged at the same positions in the first to third coil patterns 21 to 23. Therefore, as described later, when three PCB layers are stacked, the radial direction pattern portions 20g to 20l have positions where the coil patterns stacked in three layers are opposed to the magnets of the rotor at the same time, and the flow direction of the current is set equal. As a result, the combined torque is generated.

The first to third coil patterns 21 to 23 are formed so as to have a helical shape in the clockwise (CW) direction, respectively, and have a zigzag shape so as to have three protrusions and three recesses to form a roughly "star" shape.

Of course, each of the first to third coil patterns 21 to 23 has a helical shape and is directed from the inside to the outside or from the outside to the inside depending on the connection pattern of the coil pattern using the throughholes. In addition, each of the first to third coil patterns 21 to 23 may be constructed to have, for example, a star shape by combining patterns oriented in the CW or CCW direction, and may have a zigzag shape so as to have two or more protrusions and recesses in a large scale.

As shown in FIGS. 2A and 2B, each of the first to third coil patterns 21 to 23 includes three outer and inner rotating direction pattern portions 20a to 20c and 20d to 20f, and six radial direction pattern portions 20g to 20l connecting the outer rotating direction pattern portions 20a to 20c and the inner rotating direction pattern portions 20d to 20f, which are alternately connected to form a star shape as a whole.

The outer and inner rotating direction pattern portions 20a to 20c and 20d to 20f are arranged along the circumferential direction with an interval on the outer circumference and the inner circumference, respectively, each of the six radial direction pattern portions 20g to 20l is oriented along a direction which radiates from the center of the substrate 10 as a whole, and the inner ends thereof have a pattern shape such that the interval between the two inner ends is narrower to converge to the center thereof.

The stator 110 according to an embodiment interconnects the first to fifth coil patterns 21 to 25 formed on the multilayer PCB to form a stator coil L1. The number of the radial direction pattern portions 20g to 20l in the stator coil is set to any one of the same number as the number of rotor magnetic poles, one-half of the number of rotor magnetic poles or two times of the number of rotor magnetic poles, and an angle between the adjacent radial direction pattern portions from among the radial direction pattern portions 20g to 20l is set to a value of 360°/n where n may be any one of the same number, half the number, and two-times the number as the number of rotor magnetic poles.

Therefore, as shown in FIGS. 2A and 2B, when the number of the radial direction pattern portions 20g to 20l is set to the same number as the number of rotor magnetic poles, in the case of the stator having six radial direction pattern portions 20g to 20l, the angle between the adjacent radial direction pattern portions from among the radial direction pattern portions 20g to 20l is 60°, and the number of magnetic poles (i.e., N-pole and S-pole magnets) of the rotating rotor coupled to a single-phase motor is configured to have six poles, in order to form the single-phase motor.

The printed wiring 17 necessary for mounting and wiring various electronic components 16 is formed in the fourth PCB layer 14 in a conductive pattern so as to form the driving circuit 30 necessary for driving the single-phase motor.

In addition, the fourth PCB layer 14 may be formed to include fourth and fifth coil patterns 24 and 25 to be added to the first to third coil patterns 21 to 23 by utilizing a space remaining after mounting the driving circuit component, and the fourth and fifth coil patterns 24 and 25 may be omitted depending on the torque value required to rotate the rotor.

The fourth PCB layer 14 shown in FIG. 2B is shown in a perspective view, and various patterns, i.e., the fourth and fifth coil patterns 24 and 25, and the printed wiring 17 and the electronic component 16 mounted thereon are located on the rear surface of the substrate 10.

The fourth coil pattern 24 is a fan-shaped pattern having a helical shape in the clockwise (CW) direction from the outside to the inside, and the fifth coil pattern 25 is a fan-shaped pattern having a helical shape in the counter-clockwise (CCW) direction from the inside to the outside.

When the first to fourth PCB layers 11 to 14 according to an embodiment are stacked, the first to fifth coil patterns 21 to 25 are interconnected in serial or parallel manner through the eleventh to eighteenth throughholes T11 to T18, to thereby form one stator coil. The eleventh to eighteenth throughholes T11 to T18 are plated or filled with a conductive material in the throughholes. The embodiment shown in FIGS. 2A and 2B shows a structure in which the first to fifth coil patterns 21 to 25 are connected in series to form the stator coil L1.

The first PCB layer 11 is provided with a sensing coil pattern 26 formed in a fan shape so as to have a helical shape in the clockwise (CW) direction from the inside to the outside in the right side recess, and the sensing coil pattern 26 is connected to the motor driving circuit 30 of the fourth PCB layer 14 via the nineteenth and twentieth throughholes T19 and T20, and the inside of the throughholes is plated or filled with a conductive material.

In some embodiments, ten throughholes T11 to T20 are formed in the same positions of the first to fourth PCB layers 11 to 14, in order to interconnect the first to fifth coil patterns 21 to 25 and to connect the stator coil L1 formed by the first to fifth coil patterns 21 to 25 and the sensing coil pattern 26 to the motor driving circuit 30, and a soldering land 18 is formed in a conductive pattern around the throughholes T11 to T20. As shown in FIG. 1, the start portions S1 to S5 and the end portions E1 to E4 of the first to fifth coil patterns 21 to 25, both ends of the first to third jumper wire patterns J11 to J13, and the start portion Ss and the end portion Es of the sensing coil pattern 26 are formed to be wider than the portion forming a coil (winding), for example, in the form of a tear drop. Soldering lands (not shown) surrounding throughholes T11 to T20 and throughholes T11 to T20 are disposed in the widest region of the tear drop shape.

As described above, in some embodiments of the present disclosure, the thicknesses of the various coil patterns 21 to 25 in the slim-type stator are adjusted so that the starting portion and the end portion are designed to be wider than the portions forming the coil (winding) to thereby connect the various conductive coil patterns and to also increase the reliability of the connection when connecting with the printed wiring 17 constituting the motor driving circuit 30.

For example, the start and end portions of the coil patterns 21 to 25 are formed in the form of a tear drop, and throughholes and soldering lands surrounding the throughholes are arranged in the start portions S1 to S5 and the end portions E1 to E4, to thereby interconnect the coil patterns, easily connect with the printed wiring and the like, and ensure the reliability of the connection.

Further, in order to increase the reliability, at least one throughhole (at least one of T11 to T20) connecting the start portion and the end portion to each layer is formed to thus prevent a problem that the connection is cut off due to disconnection of the coil pattern, and poor plating and filling of the throughholes.

In the third PCB layer 13, a first jumper wire pattern J11 connecting a thirteenth throughhole T13 and a fourteenth throughhole T14 in order to connect the fourth coil pattern 24 and the fifth coil pattern 25 which are separately formed on the upper and lower sides of the fourth PCB layer 14, is provided along the inside of the third coil pattern 23. In addition, in order to connect the start portion S5 from the outside of the fifth coil pattern 25 to the inside thereof in the fourth PCB layer 14, a second jumper wire pattern J12 connecting a fifteenth throughhole T15 and a sixteenth throughhole T16 is formed in the lower side recess of the third coil pattern 23 in the third PCB layer 13. In the fourth PCB layer 14, a third jumper wire pattern J13 connecting the fourteenth throughhole T14 of the first jumper wire pattern J11 and the fifteenth throughhole T15 of the second jumper wire pattern J12. (J13) is formed in the outside of the fifth coil pattern 25.

When the first to fourth PCB layers 11 to 14 according to an embodiment are stacked, the first to fifth coil patterns 21 to 25 are interconnected through the throughholes T11 to T20 and the first to third jumper wire patterns J11, J12, and J13, to thereby form one stator coil.

As a result, one end of the stator coil, that is, the end portion of the fifth coil pattern 25 is connected to the first output terminal Out1 of the motor driving circuit and the other end of the stator coil, that is, the start portion S1 of the first coil pattern 21 is connected to the second output terminal Out2 of the motor driving circuit via the eighteenth throughhole T18.

Although the motor driving circuit 30 for driving the single-phase motor is mounted on the fourth PCB layer 14 in the embodiment shown in FIG. 2B, the motor driving circuit may be separately formed.

Hereinafter, a sensorless motor driving circuit 30 for driving a sensorless single-phase motor 30 will be described with reference to FIG. 10.

When the external power supply Vcc is applied to one side of the sensorless motor driving circuit 30, a constant voltage circuit 90 for generating a constant driving power supply Vdd provided to a downstream comparator is connected to the sensorless motor driving circuit 30.

The sensorless motor driving circuit 30 includes: a rotor position signal generator 31 including a first comparator OP1 configured by using an operational amplifier and generating a rotor position signal in which a high level H and a low level L are repeated periodically in accordance with the rotation of the rotor; and a switching circuit 31 including a second comparator OP2 configured by using an operational amplifier and configured to switch the direction of the current flowing to the stator coil L1 according to an output level of the rotor position signal input from the rotor position signal generator 31.

In the rotor position signal generator 31, a voltage dividing circuit formed by resistors R3 and R6 is connected in parallel between an output terminal of the constant voltage circuit 90 and the ground, and a constant first reference voltage Vref1 is applied to a non-inverting input terminal (+) of the first comparator OP1 through a resistor R4 from a connection node between the resistors R3 and R6, while an induced electromotive force induced to the sensing coil Ls due to the first reference voltage Vref1 is added and applied to an inverting input terminal (−) via the sensing coil Ls for the rotor position detection constituted by the sensing coil pattern 26 from the connection node between the resistors R3 and R6.

A resistor R7 connected between the non-inverting input terminal (+) and the output terminal of the first comparator OP1 is used for positive feedback of the output of the first comparator OP1. The output of the first comparator OP1 is output in a square wave form.

In the switching circuit 32, a rotor position signal generated from the rotor position signal generator 31 is applied to an inverting input terminal (−) of the second comparator OP2 and a constant second reference voltage Vref2 is applied to a non-inverting input terminal (+) of the second comparator OP2 via a resistor R5 from the connection node between the resistors R3 and R6. A resistor R9 connected between the non-inverting input terminal (+) and the output terminal of the second comparator OP2 is used for positive feedback of the output of the second comparator OP2. The output of the second comparator OP2 is output in a square wave form.

A stator coil L1 constituted by the first to fifth coil patterns 21 to 25 and a resistor R8 are connected in parallel between the output terminal of the switching circuit 32 and the inverting input terminal (−) of the second comparator OP2.

In addition, the output of the second comparator OP2 is connected to a frequency generator (FG) signal output unit 34. The FG signal output unit 34 is provided with an FG signal output terminal for receiving the feedback of the motor speed through a resistor R10 so as to be used for controlling the speed of the motor. A reference number C1 is used for bypassing the high frequency noise contained in the FG signal.

Since the sensing coil pattern 26 is disposed in the first PCB layer 11 of the stator 110, in the embodiment constructed above, the rotor 40, in which the N-pole and the S-pole magnets are arranged alternately, rotates. When the rotor 40 faces the N-pole magnet, an induced electromotive force (that is, a back electromotive force (back EMF)) is generated in accordance with electromagnetic induction from the sensing coil Ls and the direction of the current flowing along the sensing coil Ls is determined by the Ampere's right-hand rule.

Here, a change in a magnetic force line (or a magnetic field intensity) applied to the sensing coil Ls is generated in the form of a sinusoidal wave according to the rotation of the opposing N-pole magnet, and thus the induced electromotive force induced in the sensing coil Ls is also changed in a sinusoidal wave form with a change in the magnetic force line and with a phase difference of ¼ (90 degrees).

Therefore, the induced electromotive force induced in the sensing coil Ls is added to the first reference voltage Vref1 and input to the inverting input terminal (−) of the first comparator OP1.

Accordingly, since the voltage of the inverting input terminal (−) becomes larger than the first reference voltage Vref1 applied to the non-inverting input terminal (+) in the first comparator OP1, a rotor position signal of the low level L is generated from the output of the first comparator OP1.

Therefore, since the second reference voltage Vref2 applied to the non-inverting input terminal (+) is larger than the rotor position signal of the low level L applied to the inverting input terminal (−) in the second comparator OP2, the output of the second comparator OP2 becomes the high level H. Therefore, the current flows from the output side of the second comparator OP2 to the inverted input terminal (−) of the second comparator OP2 in the stator coil L1.

Thereafter, when the rotor continues to rotate and faces the S-pole magnet, an induced electromotive force (that is, a back electromotive force (back EMF)) is generated from the sensing coil Ls by electromagnetic induction, and the direction of the current flow is determined as opposed to the case where the rotor faces the N-pole magnet by the Ampere's right-hand rule.

Here, a change in a magnetic force line (or a magnetic field intensity) applied to the sensing coil Ls is generated in the form of a sinusoidal wave according to the rotation of the opposing S-pole magnet, and thus the induced electromotive force induced in the sensing coil Ls is also changed in a sinusoidal wave form with a change in the magnetic force line and with a phase difference of ¼ (90 degrees).

Therefore, the induced electromotive force induced in the sensing coil Ls is subtracted from the first reference voltage Vref1 and input to the inverting input terminal (−) of the first comparator OP1.

Accordingly, since the voltage of the inverting input terminal (−) becomes smaller than the first reference voltage Vref1 applied to the non-inverting input terminal (+) in the first comparator OP1, a rotor position signal of the high level H is generated from the output of the first comparator OP1.

Therefore, since the second reference voltage Vref2 applied to the non-inverting input terminal (+) is smaller than the rotor position signal of the high level H applied to the inverting input terminal (−) in the second comparator OP2, the output of the second comparator OP2 becomes the low level H. Therefore, the current flows to the output side of the second comparator OP2 from the inverting input terminal (−) of the second comparator OP2 in the stator coil L1.

As described above, in some embodiments, since the direction of the current flowing in the stator coil L1 is periodically switched by the induced electromotive force (that is, the back electromotive force (back EMF)) induced in the sensing coil Ls, it is possible to periodically switch the direction of the current flowing from the motor driving circuit 30 to the stator coil L1 without using an expensive rotor position detection sensor such as a Hall sensor. As a result, the rotor continues to rotate in the same direction as the rotating direction.

Hereinafter, when the direction of the current flowing through the stator coil L1 is determined by the induced electromotive force (i.e., back EMF) induced in the sensing coil Ls, the operation of the sensorless single-phase motor in which the rotor is rotated by the first to fifth coil patterns 21 to 25, that is, the stator coil L1 will be described.

Hereinafter, a single-phase motor using the slim-type stator according to an embodiment of the present disclosure will be described with reference to FIGS. 3A to 4D. In FIGS. 4A to 4D, the current flow for each rotational position of the rotor is the same as the current flow for the first coil pattern 21 of the first PCB layer 11 and the second to fifth coil patterns 22 to 25 of the second to fourth PCB layers 12 to 14 and thus only the first coil pattern 21 of the first PCB layer 11 will be described.

The illustrated single-phase motor 40 has a structure in which a stator 110 and a rotor 120 of a 6-slot-6-pole structure are arranged in an axial type so as to face each other, but the stator 110 and the rotor 120 of the 6-slot-6-pole structure are shown together on the same plane for convenience of explanation.

When the driving power source Vcc is supplied to the motor driving circuit 30 in the case that the rotor 120 is at the initial position (i.e., 0°), the sensing coil Ls generates the induced electromotive force (i.e., back EMF) corresponding to the sensing coil Ls because the magnet of the opposing rotor 120 is the S-pole, and accordingly the motor driving circuit 30 determines the direction of the current flowing in the stator coil L1, and applies the current to the stator coil L1.

Meanwhile, when the rotor 120 is in the initial position (i.e., 0°) in the case that one small-size Hall sensor is used for detecting the rotor position, in the single-phase motor 40, there is a dead point at which magnetic starting cannot be performed since the current is not supplied to the stator coil because the magnetic pole detection of the Hall sensor is not performed, if the Hall sensor is located at the interface of the rotor magnetic pole.

As illustrated in FIGS. 8A to 8D, which will be described later in some embodiments, a lower case 201 is made of a metal material capable of acting as a yoke, and is connected to an the annular ring portion 201b at a central portion through six bridges 201a corresponding to a number (for example, 6) of the magnetic poles of the rotor 120 so as to have a dead point prevention yoke function. Otherwise, as shown in FIG. 9, a method of arranging a dead point prevention yoke 170 can be employed at a lower portion of the stator.

First, a dead point prevention structure using the dead point prevention yoke 170 according to an embodiment of the present disclosure will be described with reference to FIG. 9.

Figure 9:
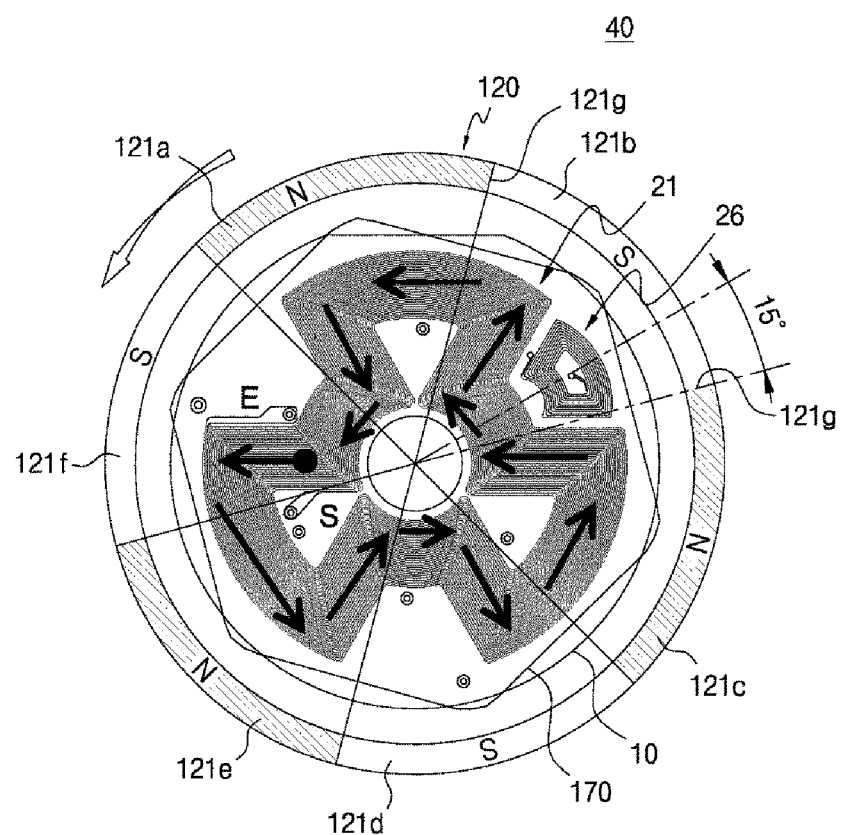
FIG. 9 is an explanatory view for explaining the arrangement relationship of a dead point prevention yoke for self-starting and a rotor in a single-phase motor according to the present disclosure.

As shown in FIG. 9, the dead point prevention yoke 170 has a hexagonal outer circumferential surface and a circular inner circumferential surface, in the same number as the number of magnetic poles of the rotor (six poles), and is located at a lower portion of the stator 110. In this case, when the rotor 120 is in an initial state (i.e., 0°), the center of each magnet is positioned opposite to the widest point (i.e., the edge) of the effective area of the dead point prevention yoke 170 by the magnetic phenomenon between the magnet 121 of the rotor 120 and the dead point prevention yoke 170.

The dead point prevention yoke 170 preferably uses a soft magnetic material having a low coercive force such as silicon steel or pure iron so as to serve as a yoke.

In addition, the sensing coil pattern 26 constituting the sensing coil Ls is disposed on the first PCB layer 11 of the stator 110 and preferably the center of the sensing coil pattern 26 is disposed at a position shifted by a ¼ magnetic pole width from the interface 121g of the magnetic pole.

The reason why the sensing coil pattern 26 is disposed at this position is that, when the initial state of the rotor 120 is taken into account, this point avoids the dead point and the magnetic flux generated from the magnet 121 is the maximum, and thus the sensing coil pattern 26 can generate the rotor position detection signal with the best sensitivity.

In other words, considering the initial state of the rotor 120, the sensing coil pattern 26 is installed in the stator 110 at a position shifted by a ¼ magnetic pole width (15° in the case of a six-pole rotor) from the interface 121g of the magnetic pole or by a ¼ magnetic pole width (15° in the case of a six-pole rotor) from the center of the magnetic pole.

When the driving power is applied to the motor driving circuit and thus the rotor is started, the sensing coil pattern 26 is opposed to a point where the sensing coil pattern 26 moves away from the magnetic pole interface (i.e., the neutral point) of the rotor and the magnetic flux generated from the magnet 121b is the maximum, to thereby easily perform self-starting of the rotor.

When the sensing coil pattern 26 faces the S-pole magnet 121b of the rotor, an induced electromotive force (that is, a back electromotive force (back EMF)) is generated from the sensing coil Ls by electromagnetic induction, and the direction of the current flowing along the sensing coil Ls is determined inversely to the case where the rotor faces the N-pole magnet by the Ampere's right-hand rule.

Here, a change in a magnetic force line (or a magnetic field intensity) applied to the sensing coil Ls is generated in the form of a sinusoidal wave according to the rotation of the opposing S-pole magnet, and thus the induced electromotive force induced in the sensing coil Ls is also changed in a sinusoidal wave form with a change in the magnetic force line and with a phase difference of ¼ (90 degrees).

Therefore, the induced electromotive force induced in the sensing coil Ls is subtracted from the first reference voltage Vref1 and input to the inverting input terminal (−) of the first comparator OP1, so that the voltage of the inverting input terminal (−) of the first comparator OP1 becomes smaller than the first reference voltage Vref1 applied to the non-inverting input terminal (+) thereof. Therefore, a rotor position signal of the high level H is generated at the output of the first comparator OP1.

Therefore, the output of the second comparator OP2 becomes low level (L), since the rotor position signal (the high level H) of the inverting input terminal (−) of the second comparator OP2 is larger than the second reference voltage Vref2 of the non-inverting input terminal (+) thereof. Therefore, the current flows to the output side of the second comparator OP2 from the inverting input terminal (−) of the second comparator OP2 in the stator coil L1.

Figure 3A:
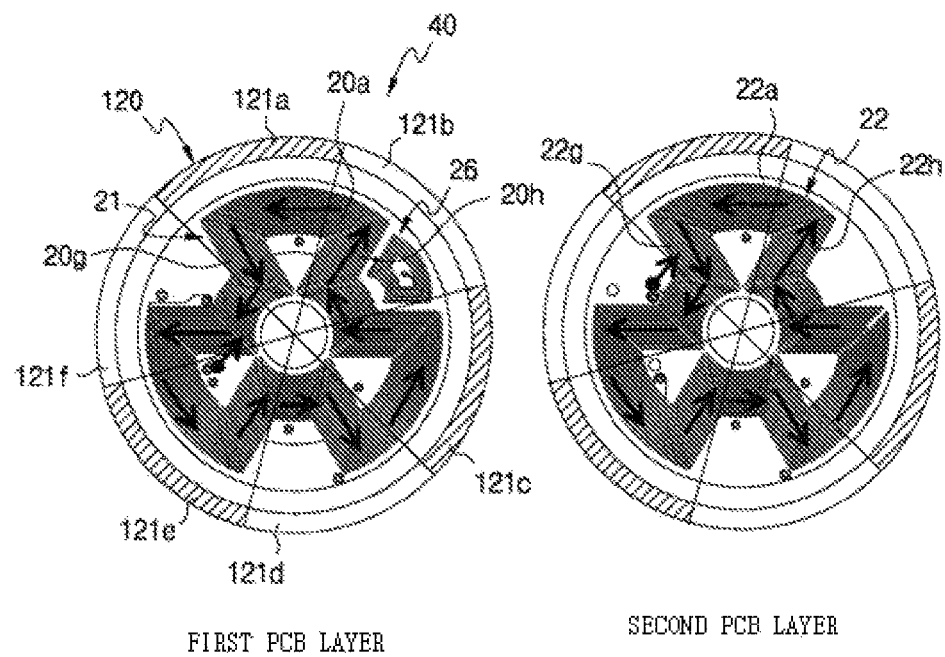
FIGS. 3A and 3B are explanatory diagrams for explaining the operation of a single-phase motor using a slim-type stator according to the present disclosure, which show the directions of currents when the rotor is at the initial position.
Figure 3B:
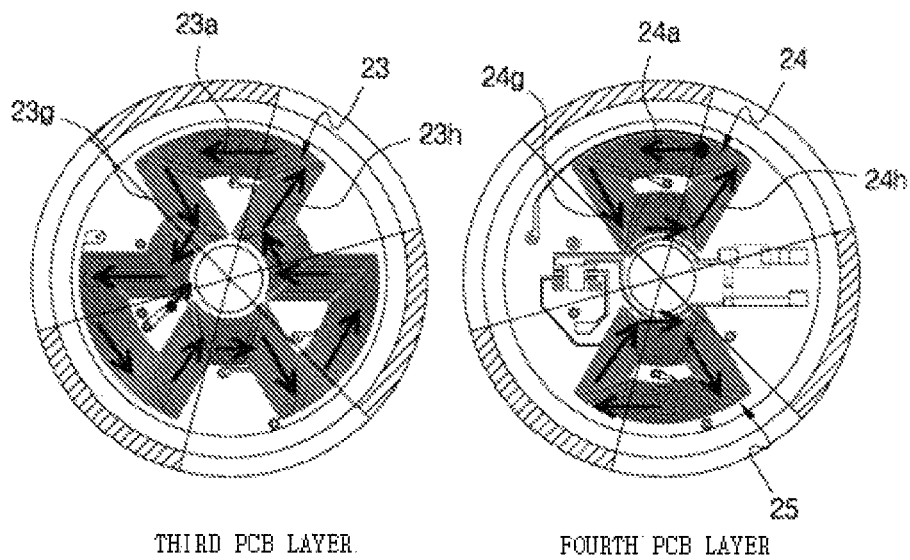
Figure 10:
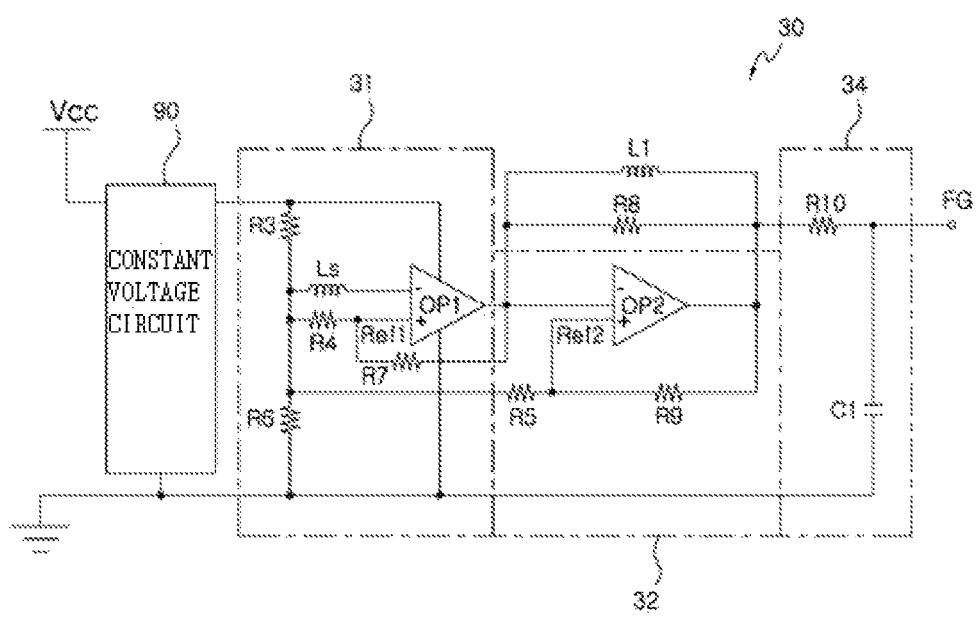
FIG. 10 is a circuit diagram of a sensorless motor driving circuit for driving a sensorless single-phase motor according to the present disclosure.

In this case, when it is set that one end of the stator coil L1 connected to the inverting input terminal (−) of the second comparator OP2 in the motor driving circuit 30 of FIG. 10 is the end portion of the fifth coil pattern 25 in FIG. 2B, that is, the first output terminal Out1, and the other end of the stator coil L1 connected to the output terminal of the second comparator OP2 is the second output terminal Out2 connected to the start portion of the first coil pattern 21 through the eighteenth throughhole T18, the rotor is started with the S-pole magnet 121b of the rotor facing the sensing coil pattern 26, and thus the direction of the current flow is indicated as arrow marks in the first to fifth coil patterns 21 to 25 shown in FIGS. 3A and 3B.

In this case, the radial direction pattern portions 20g and 20h of the first coil pattern 21, the radial direction pattern portions 22g and 22h of the second coil pattern 22, the radial direction pattern portions 23g and 23h of the third coil pattern 23, and the radial direction pattern portions 24g and 24h of the fourth coil pattern 24 are all set to have the current flow direction in an identical direction. As a result, tangential force F is generated in the radial direction pattern portions 20g to 20l in the clockwise (CW) direction in accordance with the Fleming's left-hand rule, and thus the rotor is rotated in the clockwise (CW) direction.

In addition, the outer rotating direction pattern portion 20a connecting between the radial direction pattern portions 20g and 20h, the outer rotating direction pattern portion 22a connecting the radial direction pattern portions 22g and 22h, the outer rotating direction pattern portion 23a connecting between the radial direction pattern portions 23g and 23h and the outer rotating direction pattern portion 24a connecting between the outer rotating direction pattern portions 24g and 24h cause the direction of the force F generated according to the Fleming's left-hand rule to be directed to the radial direction, and thus do not affect the torque generation.

However, when the rotor is in the initial state (i.e., 0°), the rotor can be started with the N-pole magnet facing the sensing coil pattern 26 instead of the S-pole magnet 121b. In this case, the directions in which the currents flow in the first to fifth coil patterns 21 to 25 are set to be opposite to the directions of the arrows of the first to fifth coil patterns 21 to 25 shown in FIGS. 3A and 3B.

When the directions of the currents flowing through the first to fifth coil patterns 21 to 25 are set reversely in this manner, the radial direction pattern portions 20g to 20l generate the tangential force F in the counterclockwise (CCW) direction in accordance with the Fleming's left-hand rule, and the rotor is rotated in the counterclockwise (CCW) direction.

As described above, the sensorless single-phase motor 40 using the sensing coil Ls cannot be rotationally driven in advance to rotate the rotor predeterminedly in either the clockwise (CW) direction or the counterclockwise (CCW) direction, differently from the case of using the Hall sensor.

Therefore, in some embodiments of the present disclosure, when the rotor is rotated in either the clockwise (CW) direction or the counterclockwise (CCW) direction after the rotor is started in the initial state, the rotor continues to rotate in the direction in which the rotor rotates by periodically changing the flow direction of the current to the stator coil L1, every time the polarity of the rotor is changed.

When the current flows, since the outer and inner rotating direction pattern portions 20a to 20c and 20d to 20f of the first to fifth coil patterns 21 to 25 are arranged in a substantially concentric circle shape, the force (F) generated by the Fleming's left-hand rule is directed in the radial direction and thus does not affect the torque generation.

Therefore, the outer and inner rotating direction pattern portions 20a to 20c and 20d to 20f of the first to fifth coil patterns 21 to 25 serve only as a path through which current flows, and a force is generated in the tangential direction from the six radial direction pattern portions 20g to 20f, to rotate the rotor 120.

Further, the directions of the currents flowing in the coils between the adjacent radial direction pattern portions 20g to 20l are set opposite to each other, and the magnetic poles of the corresponding magnets of the rotor 120 are also reversely positioned. Thus, the force pushing or pulling the magnets of the rotor in the same direction is generated to thereby rotate the rotor counterclockwise (CCW).

Figure 4A:
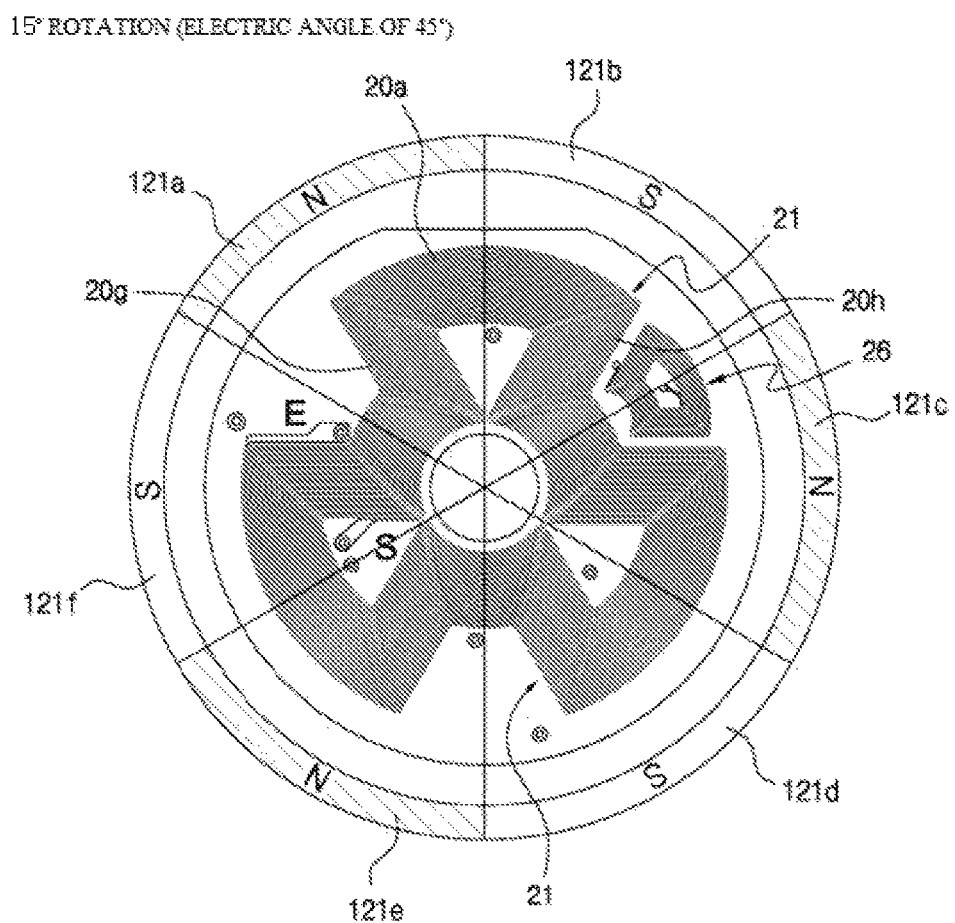
FIGS. 4A to 4D are explanatory diagrams showing directions of currents according to the rotating positions of the rotor, respectively.

FIG. 4A shows a case where the rotor rotates counterclockwise (CCW) and the rotor 120 rotates by a machine angle of 15° (an electrical angle of 45°).

When the rotor 120 is positioned at the position shown in FIG. 4A, the sensing coil pattern 26 is positioned at the interface between the S-pole magnet 121b and the N-pole magnet 121c, to thereby fail to recognize the magnetic pole and to determine the flow direction of the current.

Figure 4B:
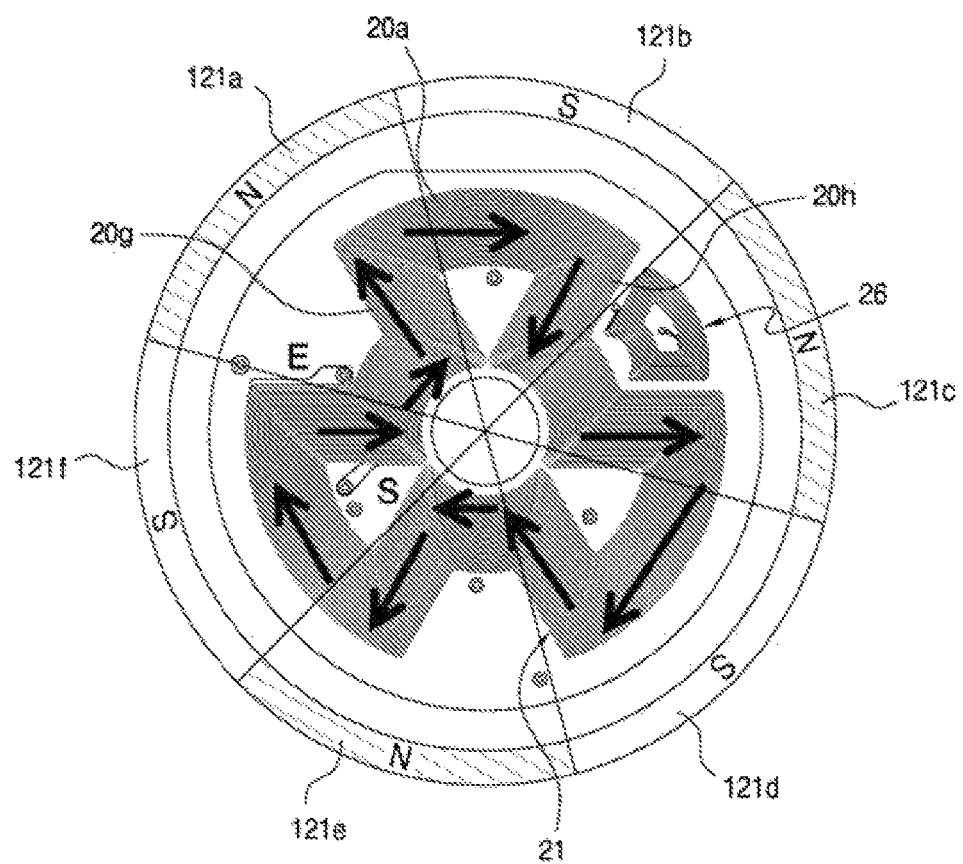
Figure 4C:
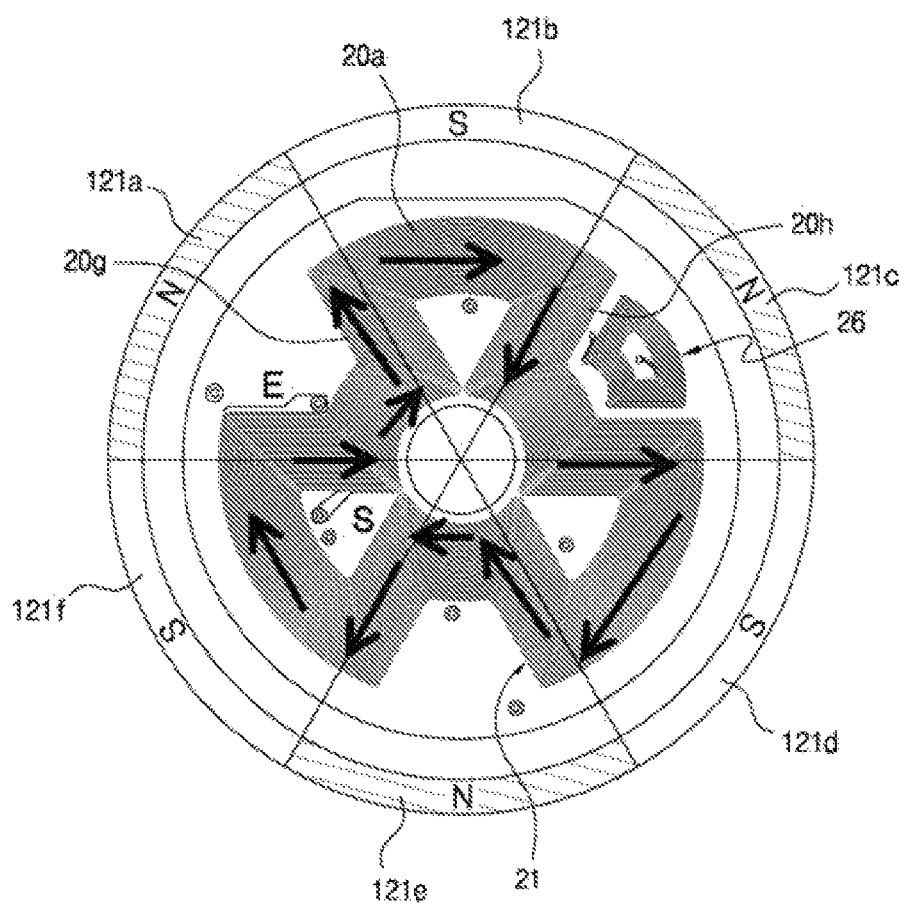
Figure 4D:
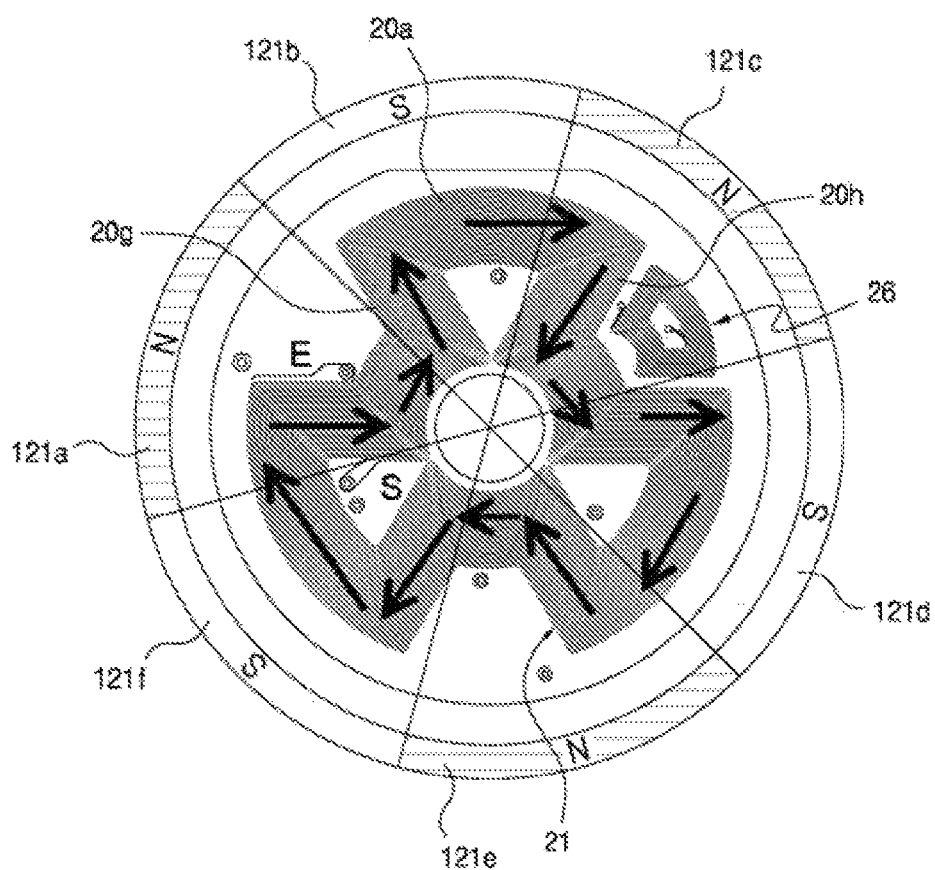

FIG. 4B shows a case where the rotor 120 is continuously rotated by the rotational inertia and rotated by a machine angle of 30° (an electrical angle of 90°). FIG. 4C shows a case where the rotor 120 is continuously rotated by the rotational inertia and rotated by a machine angle of 45° (an electrical angle of 135°). FIG. 4D shows a case where the rotor 120 is continuously rotated by the rotational inertia and rotated by a machine angle of 60° (an electrical angle of 180°).

When the rotor rotates over a mechanical angle of 15° (an electrical angle 45°), the sensing coil pattern 26 recognizes the N-pole magnet 121c. In this case, the output of the first comparator OP1 and the output of the second comparator OP2 are also set reversely to each other as the induction electromotive force opposite to the case of recognizing the S-pole magnet 121b is generated in the sensing coil pattern 26, and the directions of the current flowing in the first to fifth coil patterns 21 to 25 also change in the direction of the arrow marks shown in FIG. 4B.

When the directions of the currents flowing through the first to fifth coil patterns 21 to 25 are set reversely in this manner, the radial direction pattern portions 20g to 20l generate the tangential force F in the counterclockwise (CCW) direction in accordance with the Fleming's left-hand rule, and the rotor is continuously rotated in the counterclockwise (CCW) direction.

As a result, as shown in FIGS. 4B to 4D, when the current flow directions of the driving currents for the first to fifth coil patterns 21 to 25 are reversed, the radial direction pattern portions 20g to 20l generate a tangential force F in the counterclockwise (CCW) direction in accordance with the Fleming's left-hand rule to thereby rotate the rotor 120.

The rotor position signal generator 31 of the motor driving circuit 30 detects the magnetic pole of the rotor every time the rotor 120 rotates by a mechanical angle of 60° (an electrical angle of 180°) and generates the rotor position detection signals of the low level L and the high level H alternately. Accordingly, the switching circuit 32 changes the current flow direction of the driving current to the first to fifth coil patterns 21 to 25.

Hereinafter, a cooling fan using the sensorless single-phase motor will be described.

Figure 5:
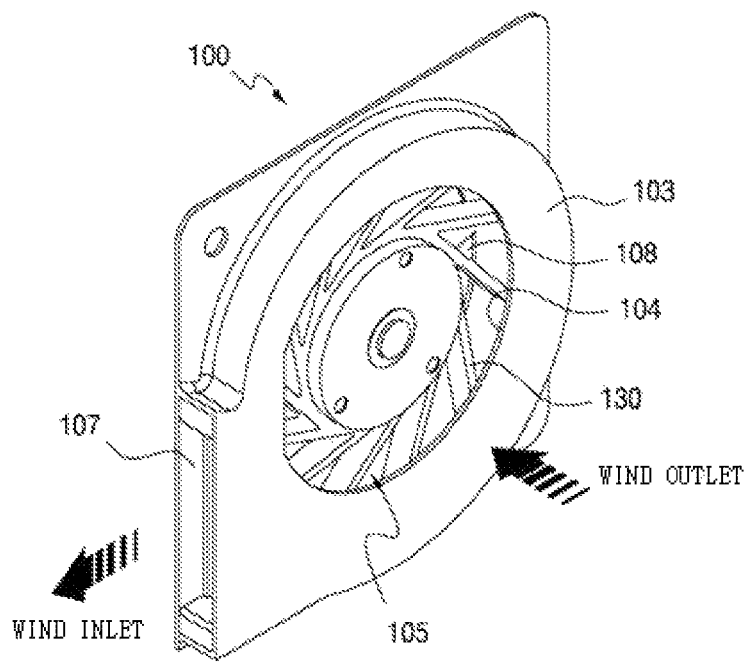
FIG. 5 is a perspective view showing a cooling fan using a sensorless single-phase motor implemented using a slim-type stator according to the present disclosure.
Figure 6:
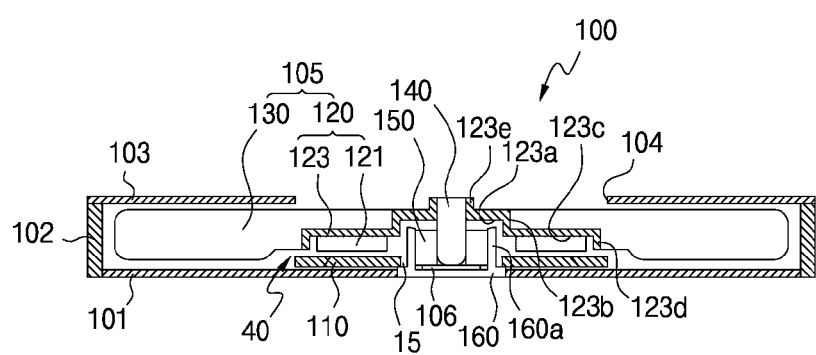
FIGS. 6 and 7 are axial cross-sectional views illustrating first and second embodiments of a slim-type cooling fan according to the present disclosure.
Figure 7:
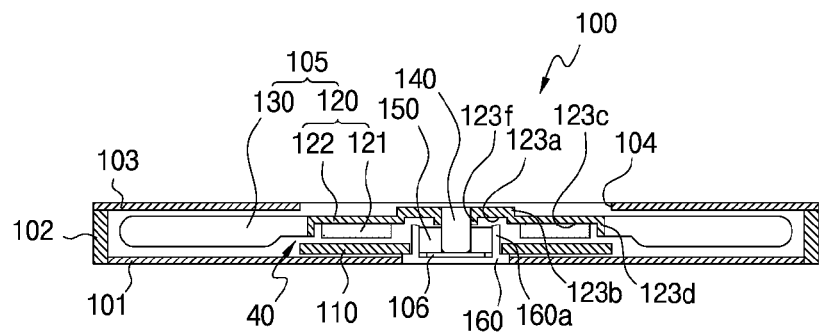

FIG. 5 shows a cooling fan using a sensorless single-phase motor implemented using a slim-type stator according to the present disclosure. FIGS. 6 and 7 are axial cross-sectional views showing a slim-type cooling fan according to the first and second embodiments of the present disclosure.

Referring to FIGS. 5 and 6, a cooling fan 100 using a slim-type single-phase motor according to an embodiment of the present disclosure includes a case formed by coupling an upper case 103 and a lower case 101 having a side wall 102 formed therein, and a slim-type single-phase motor 40 implemented using a slim-type stator 110 provided inside the case.

The single-phase motor 40 includes the slim-type stator 110, a sleeve bearing 150, a rotating shaft 140, and a rotor 120.

A bearing holder 160 for receiving the sleeve bearing 150 at a central portion of the lower case 101 is integrally formed by, for example, insert molding. The bearing holder 160 includes the sleeve bearing 150 inserted into a cylindrical protruded boss 160a.

In addition, a thrust plate (or a bearing seat) 106 is provided between the sleeve bearing 150 and the inner bottom surface of the bearing holder 160 to support the rotating shaft 140 of the rotor 120.

The slim-type stator 110 according to the embodiment of the present disclosure as shown in FIG. 1 is mounted on the bottom surface of the lower case 101. The stator 110 has, at a central portion of the stator, a penetration opening 15 formed larger than an outer diameter of the boss 160a of the bearing holder 160.

The rotating shaft 140 of the rotor 120 is coupled to the penetration opening of the sleeve bearing 150 and the rotating shaft 140 is fixed to the center of the rotor 120.

The rotor 120 includes a back yoke 123 made of a magnetic material and a plurality of magnets 121 so as to serve as a magnetic path and the magnets 121 constitute a single-phase motor 40 in an axial type structure in which the magnets 121 are disposed in a face-to-face fashion to the coil of the stator 110.

It is preferable that the plurality of magnets 121 are arranged such that N-poles and S-poles are alternately arranged and the number of magnetic poles is the same as the number of the radial direction pattern portions 20g through 20l of the coil pattern 21. Accordingly, the single-phase motor 40 constructed using the stator 110 of FIG. 1 has a six-slot/six-pole structure, and the stator 110 has the sensing coil pattern 26 for the sensorless drive. The motor driving circuit 30 performs the sensorless drive on the stator coil L1 using the sensing coil Ls as described above.

The back yoke 123 includes, at a center of the back yoke 123, a coupling portion 123e having a penetration opening through which the rotating shaft 140 is fixed, and protrudes outward.

The back yoke 123 has a first cylindrical portion 123b which has a first end receiving groove 123a formed on the inner side and is formed larger than the outer diameter of the boss 160a of the bearing holder 160, and a second cylindrical portion 123d which has a second end receiving groove 123c formed on the outer side and is formed in a size corresponding to the stator 110. A stepped portion is formed in an intermediate portion between the first cylindrical portion 123b and the second cylindrical portion 123d so as to form a receiving groove having a two-stage structure.

The bearing holder 160 is accommodated in the first end accommodating groove 123a of the back yoke 122 and a plurality of magnets 121 are installed in the second end accommodating groove 123c in correspondence with the coil pattern 21 of the stator 110.

The plurality of magnets 121 may be formed of a structure of N-poles and S-poles by split magnetization using a rare-earth magnet or a ferrite magnetic substance having a large coercive force such as an Nd alloy or Co alloy, or may be used by fixing disk-shaped Nd magnets to a rotor support with an adhesive.

A plurality of blades 130 are integrally formed on the outer surface of the back yoke 123 of the rotor 120 by insert molding to constitute an impeller 105. In this case, the blades 130 extend to the same level as the first cylindrical portion 123b while surrounding the outer surface of the stepped portion 123b of the back yoke 123 and the second end receiving groove 123c. The plurality of blades 130 may extend from the back yoke 123 at an inclination angle or may extend in the radial direction as shown in FIG. 6.

Further, the lower case 101 may include a through slot formed so that a connector or a cable necessary for applying power and control signals from a system body is coupled to the stator 110, and a wind inlet 108 including at least one penetration opening formed so as to suck the heated air inside the main body (for example, a wireless charger or the like) from a direction facing the lower case 101.

As shown in FIG. 6, the lower case 101 includes a side wall 102 formed at right angles to the outer circumferential portion thereof and is joined together with the upper case 103 to form a Sirocco type fan, and thus, one side of the side wall 102 is opened to form a wind outlet 107 for blowing out the sucked air. In this case, the side wall 102 is formed of the same resin as the bearing holder 160 and is integrally formed with the lower case 101 made of metal by insert molding.

However, the side wall 102 may be formed by insert molding together with the upper case 103 instead of the lower case 101. In addition, both the bearing holder 160 and the lower case 101 may be integrally formed by insert molding using resin.

The upper case 103 is also provided with a wind inlet 104 having at least one penetration opening for sucking the heated air inside the main body (for example, a wireless charger or the like) from a direction opposite to the upper case 103, similarly to the lower case 101.

The cooling fan 100 according to the embodiment of the present disclosure is an example in which the wind inlets are formed in both the upper case 103 and the lower case 101, respectively, as shown in FIG. 6, but it is possible to form a wind inlet 104 in one of the upper case 103 and the lower case 101, for example, it is also possible that the wind inlet 104 is formed only in the upper case 103.

In addition, the cooling fan 100 according to the embodiment of the present disclosure may be configured to be of an axial flow type which is introduced from one side of the upper case 103 and the lower case 101 and discharged to the other side thereof, depending on the blade shape of the impeller 105, without forming the penetration openings in all the side walls 102, instead of forming the wind outlet 107 at one side of the side wall 102.

The cooling fan 100 according to the embodiment of the present disclosure configured as described above employs a single-phase motor 40 as an axial type structure and is configured to include a thin film slim-type stator as the single-phase motor. As a result, the cooling fan 100 according to the embodiment of the present disclosure can be implemented as a slim-type cooling fan 100 because of realizing a single-phase motor 40 having a slimmer structure than a conventional fan motor using a core-type stator.

In addition, the cooling fan 100 according to the embodiment of the present disclosure has a structure in which the diameter of a sleeve bearing 150 that supports the rotating shaft 140 of the rotor 120 can be extended to contain sufficient oil by utilizing a space that is obtained by removing a core type stator used in a conventional radial type motor.

In the first embodiment, when the lower case 101 uses a metal material such as a soft magnetic material capable of acting as a yoke, a bridge serving as a dead point prevention yoke is integrally formed in the lower case as in the third embodiment. When the lower case is made of synthetic resin, it is possible to dispose the dead point prevention yoke 170 below the stator, so as to avoid the sensing coil pattern 26 from being located on the interface 121g of the rotor magnetic pole when the rotor 120 is at the initial position (i.e., 0°).

Referring to FIG. 7, the second embodiment of the present disclosure differs from the first embodiment only in the structure of the rotor and the impeller, and the former is the same as the latter, in view of the other parts. Therefore, a description thereof will be omitted.

In the second embodiment, the back yoke 122 of the rotor 120 includes, at the center thereof, a coupling portion 123f having a penetration opening through which the rotating shaft 140 is fixed, and which protrudes inward.

The back yoke 122 has a first cylindrical portion 123b which has a first end receiving groove 123a formed on the inner side and is formed larger than the outer diameter of the boss 160a of the bearing holder 160, and a second cylindrical portion 123d which has a second end receiving groove 123c formed on the outer side and is formed in a size corresponding to the stator 110. A stepped portion is formed in an intermediate portion between the first cylindrical portion 123b and the second cylindrical portion 123d so as to form a receiving groove having a two-stage structure.

The bearing holder 160 is accommodated in the first end accommodating groove 123a of the back yoke 122 and a plurality of magnets 121 are installed in the second end accommodating groove 123c in correspondence with the coil pattern 21 of the stator 110.

The back yoke 122 of the rotor 120 has a coupling portion 123f having a penetration opening through which the rotating shaft 140 is fixed and which protrudes inward and the length of the sleeve bearing 150 is set to a reduced length by the inwardly protruding length of the coupling portion 123f as compared with the first embodiment.

A plurality of blades 130 integrally formed by insert molding on the outer surface of the back yoke 123 so as to constitute the impeller 105 in the first embodiment are extensibly formed in the same level as the second cylindrical portion 123d, while surrounding the second end receiving groove 123c of the back yoke 123.

In addition, the blades 130 according to the second embodiment are set to have a narrow width as compared with the blades according to the first embodiment and the exposed surface of the back yoke 122 and the rotating shaft 140 are set in substantially the same level as the upper case 103. As a result, the heights of the side walls 102 between the upper case 103 and the lower case 101 can be lowered.

As described above, the cooling fan 100 according to the second embodiment of the present disclosure forms the coupling portion 123f of the back yoke 122 inwardly and at the same time, the thickness of the entire cooling fan 100 can be more slimly designed by lowering the heights of the sleeve bearing 150, the rotating shaft 140, the blades 130 and the side walls 102.

Figure 8A:
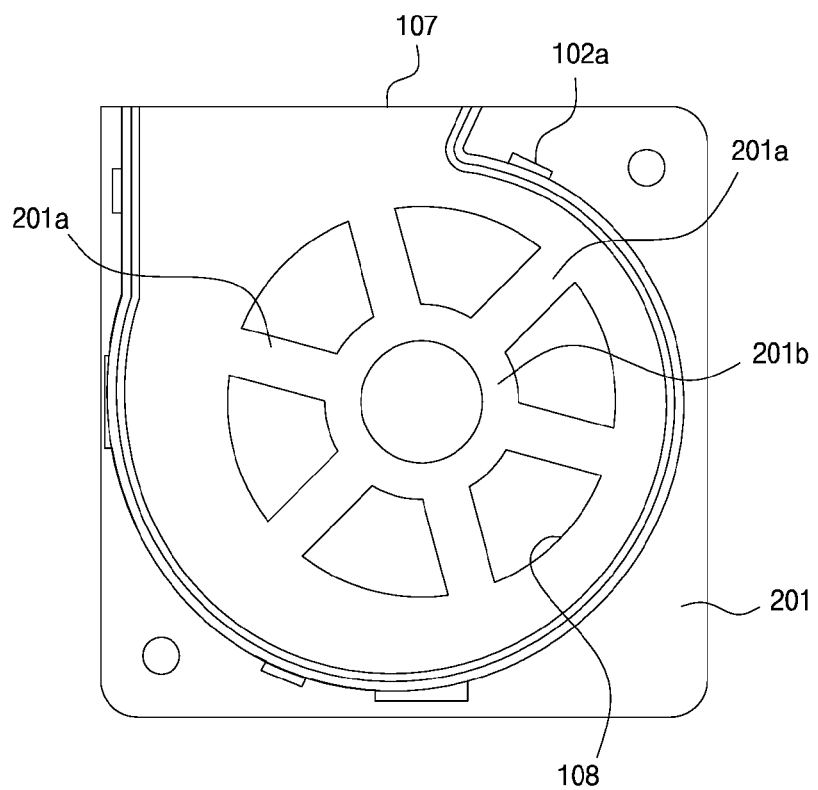
FIG. 8A is a plan view showing a lower case having a dead point prevention yoke function in a cooling fan according to a third embodiment of the present disclosure.
Figure 8B:
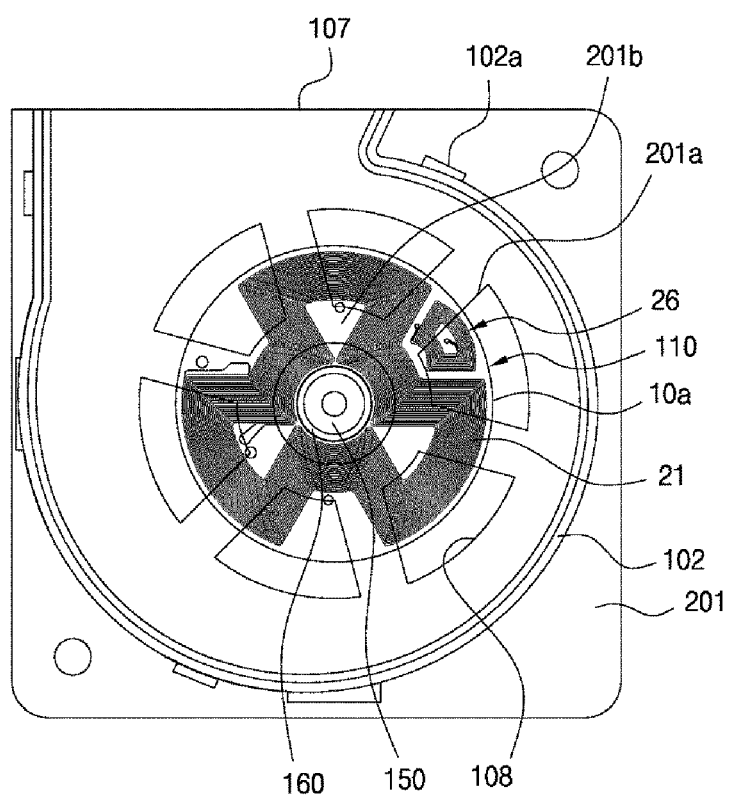
FIG. 8B is a plan view showing a state in which a slim-type stator is coupled to the lower case in FIG. 8A.
Figure 8C:
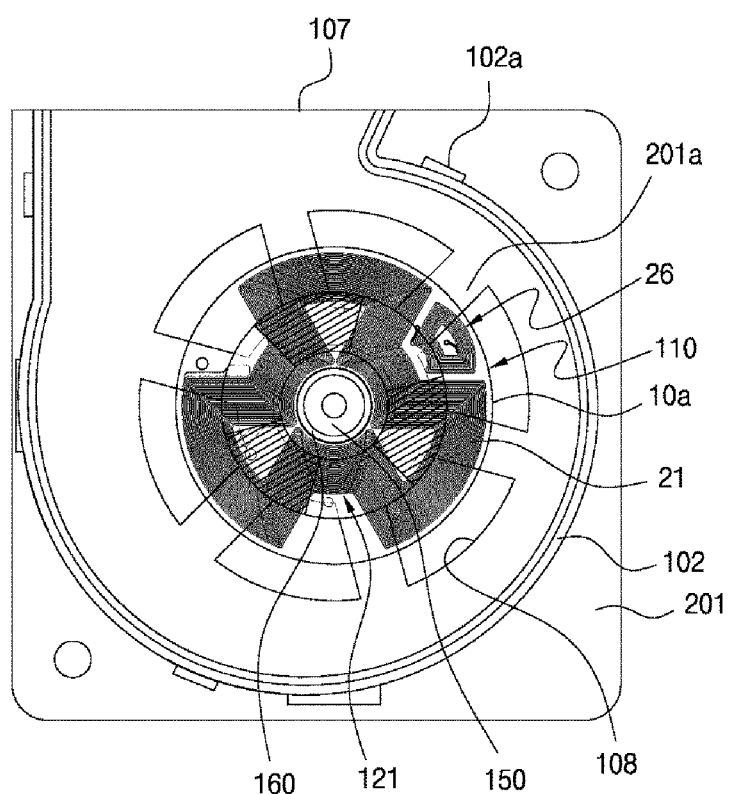
FIG. 8C is a plan view showing a state where the rotor is coupled to the stator in FIG. 8B.
Figure 8D:
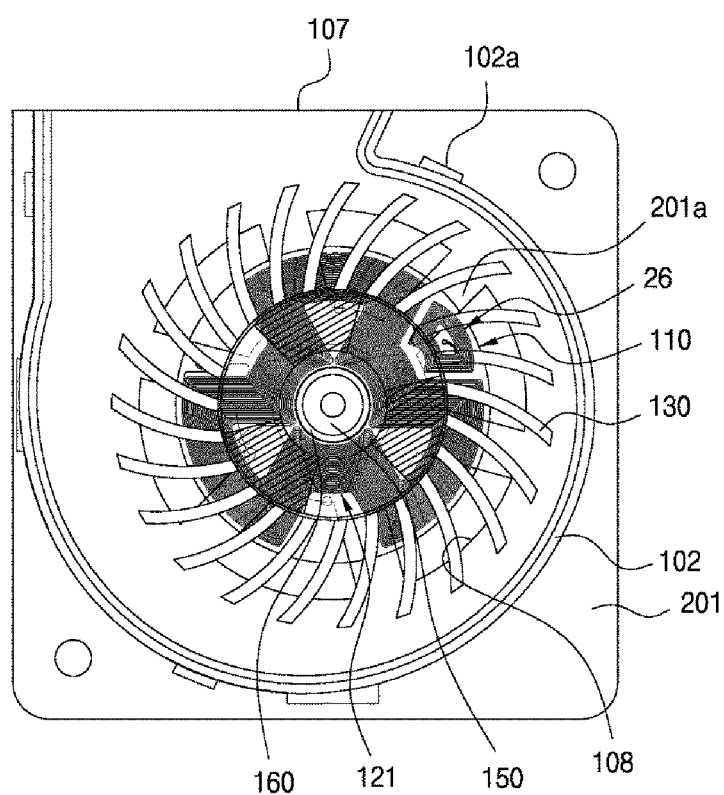
FIG. 8D is a plan view showing a state where blades are coupled to the rotor in FIG. 8C.

FIG. 8A is a plan view showing a lower case having a dead point prevention yoke function in a cooling fan according to a third embodiment of the present disclosure. FIG. 8B is a plan view showing a state in which a slim-type stator is coupled to the lower case in FIG. 8A. FIG. 8C is a plan view showing a state where the rotor is coupled to the stator in FIG. 8B. FIG. 8D is a plan view showing a state where blades are coupled to the rotor in FIG. 8C.

Referring to FIGS. 8A to 8D, a cooling fan 100 according to a third embodiment of the present disclosure includes a sensing coil pattern 26 for sensorless driving in a stator, and also employs a lower case 201 having a dead point prevention yoke function. In this matter, the third embodiment is different from the first and second embodiments.

In some embodiments of the present disclosure, instead of separately using the dead point prevention yoke 170 shown in FIG. 9, the lower case 201 may have a dead point prevention yoke function.

The lower case 201 according to the third embodiment uses a metal material capable of acting as a yoke like an iron plate and is connected to an annular ring portion 201b at a central portion through bridges of the number corresponding to the number of magnetic poles of the rotor 120 so as to have a dead point prevention yoke function, for example, six bridges 201a.

The lower case 201 may be formed in a square shape, for example, and one side where the side wall 102 is not formed forms the wind outlet 107 when the upper case 103 is coupled to the lower case 201.

In this case, a penetration opening 15 is formed at the center of the annular ring portion 201b so that the bearing holder 160 can pass through the penetration opening 15.

In the illustrated third embodiment, the bridges 201a of the number corresponding to the number of magnetic poles of the rotor 120 are used, but it is also possible to use bridges 201a having the number of (the number of magnetic poles/2).

When the bridges 201a corresponding to the number of magnetic poles of the rotor 120 are formed in the lower case 201 made of a metal material capable of serving as a yoke as described above, the center of each magnet is positioned between the magnet 121 and the bridge 201a of the rotor 120 by the magnetic phenomenon while being opposed to the bridge 201a in an initial state of the rotor 120.

Therefore, in consideration of the initial state of the rotor, the sensing coil pattern 26 is provided on the stator 110 at a position shifted by a ¼ magnetic pole width (15° in the case of a six-pole rotor) from the interface of the magnetic poles. That is, the sensing coil pattern 26 is provided at a position shifted by a ¼ magnetic pole width (15° in the case of a six-pole rotor) from the interface 121g between the S-pole magnet 121b and the N-pole magnet 121c.

When the above condition is satisfied, the sensing coil Ls detects the magnetic pole of the opposing rotor because the sensing coil pattern 26 is installed while avoiding the dead point area when the rotor 120 is started in the initial state, and the motor driving circuit 30 can apply the corresponding drive signal to the stator coil L1.

As a result, the six bridges 201a formed in the lower case 201 have the dead point prevention yoke function, and the space between the bridges 201a serves as the wind inlet 108.

In this case, the magnets 121 of the rotor 120 are formed in a ring shape and multipolar magnetized so that N-poles and S-poles are alternately arranged, and the width of the ring is formed greater than at least the length of the radial direction pattern portions 20g to 20l. Also, the magnets 121 of the rotor 120 are preferably disposed so as to face the radial direction pattern portions 20g to 20l.

In FIG. 8D, a plurality of blades 130 integrally formed on the rotor 120 constitute an impeller 105. A reference number 102a refers to a snap engagement portion that is integrally formed on side walls of the rotor 120, and used when engaged with the upper case 103.

In some embodiments of the present disclosure, since the bridges 201a corresponding to the number of rotor magnetic poles are formed while forming a wind inlet in the lower case 201, and thus a sensorless drive function can be implemented together with dead point prevention in the slim-type cooling fan without using a separate dead point prevention yoke.

In the above embodiments, the case where the single-phase motor is applied to the cooling fan for cooling electronic equipment has been described. However, the single-phase motor according to the present disclosure can be applied to an aspiration motor for an in-car sensor detecting an indoor temperature of a vehicle. In addition to a fan motor, the single-phase motor according to the present disclosure can be applied to other fields that require a compact slim-type motor.

In addition, the single-phase motor of the above-described embodiments can be operated not only by the single-phase full-wave driving system but also by the single-phase half-wave driving system.

In the above description of the embodiments, the case where a slim-type stator in which a plurality of printed circuit board (PCB) layers are stacked is used for a single-phase motor has been described. However, in the case of a motor having a small number of turns required for forming a stator coil, it is possible to construct a slim-type stator by using a double-sided PCB. That is, it is also possible to form a coil pattern on one surface of a double-sided printed circuit board (PCB) and form a motor driving circuit on the other surface thereof.

While the present disclosure has been particularly shown and described with reference to exemplary embodiments thereof, by way of illustration and example only, it is clearly understood that the present disclosure is not to be construed as limiting the present disclosure, and various changes and modifications may be made by those skilled in the art within the protective scope of the invention without departing off the spirit of the present disclosure.

INDUSTRIAL APPLICABILITY

A coil pattern is formed using a multilayer printed circuit board (PCB) and a sensing coil pattern for sensorless driving is integrally provided, sensorless driving is performed on the stator coil using the sensing coil in the motor driving circuit in the present disclosure. Thus, the present disclosure can be applied to a slim-type stator, and a cooling fan having a sensorless single-phase motor drive and a dead point prevention yoke function.

What is claimed is:

1. A slim-type stator comprising:
a multilayer printed circuit board (PCB);
a coil pattern patterned on respective PCB layers of the multilayer PCB and connected through throughholes; and
a sensing coil pattern formed on an uppermost PCB layer of the multilayer PCB to detect a rotor rotation position, wherein the sensing coil pattern is positioned and set at a position deviated from a magnetic pole interface of a rotor that is positioned and set by a dead point prevention yoke when the rotor is in an initial state.

2. The slim-type stator of claim 1, wherein the sensing coil pattern is disposed at a position deviated by a ¼ magnetic pole width from the interface of the magnetic poles or the center of the magnetic poles.

3. The slim-type stator of claim 1, wherein the dead point prevention yoke has a polygonal shape having outer peripheral portions of the same number as the number of magnetic poles of the rotor and having a circular inner circumferential surface.

4. The slim-type stator of claim 3, wherein the dead point prevention yoke is stacked on a lower portion of the stator.

5. The slim-type stator of claim 1, further comprising a motor driving circuit mounted on the lowermost PCB layer of the multilayer PCB and applying a driving current to a stator coil formed by the coil pattern.

6. The slim-type stator of claim 5, wherein the motor driving circuit comprises:
a rotor position signal generator for generating a rotor position signal corresponding to the rotor magnetic pole when the sensing coil formed by the sensing coil pattern generates an induced electromotive force corresponding to the magnetic pole of the opposite rotor; and
a switching circuit for switching the direction of the driving current applied to the stator coil in correspondence to the rotor position signal generated from the rotor position signal generator in correspondence to the magnetic pole of the opposite rotor.

7. The slim-type stator of claim 1, wherein the dead point prevention yoke is implemented using a plurality of bridges formed in correspondence to the number of magnetic poles of the rotor in a case where the stator is installed.

8. The slim-type stator of claim 1, wherein the coil pattern comprises:
inner and outer rotating direction pattern portions which are arranged in a circumferential direction at intervals along an inner circumference and an outer circumference concentrically; and
radial pattern portions that interconnect the inner rotating direction pattern portion and the outer rotating direction pattern portion that are adjacent to each other and that are disposed along the radial direction.

9. The slim-type stator of claim 8, wherein the coil pattern is configured so that the inner and outer rotating direction pattern portions and the radial direction pattern portions have a shape in which a plurality of protrusions and a plurality of recesses are repeatedly formed, respectively, and the sensing coil pattern is formed in one of the plurality of recesses of the coil pattern.

10. The slim-type stator of claim 1, wherein the coil pattern and the sensing coil pattern are spirally patterned to form a plurality of turns, respectively.

11. The slim-type stator of claim 8, wherein the number of the radial direction pattern portions is set to any one of the same number, half the number, and two-times the number as the number of rotor magnetic poles.

12. The slim-type stator for a single-phase motor of claim 8, wherein an angle between the adjacent radial direction pattern portions is set to a value of 360°/n where n is any one of the same number, half the number, and two-times the number as the number of rotor magnetic poles.

13. The slim-type stator of claim 1, wherein the coil pattern is patterned in the same shape on each PCB layer.

14. The slim-type stator of claim 1, wherein the coil pattern is patterned so that a first pattern formed on the odd-numbered PCB layer is different from a second pattern formed on the even-numbered PCB layer, in which the second pattern may have a shape that is obtained by rotating the first pattern from the center thereof by (360°/the number of magnetic poles of the rotor).

15. The slim-type stator of claim 8, wherein the plurality of radial direction pattern portions of the coil pattern are connected in such a manner that a current flows in the same direction, thereby generating a rotational force in the tangential direction to a rotor.

16. The slim-type stator of claim 1, wherein a start portion and an end portion of the coil pattern are formed wider than the portion forming the coil, and at least one throughhole and a soldering land surrounding the throughhole are disposed.

17. A sensorless single-phase motor comprising:
a rotor having a rotating shaft supported at a center of the rotor and having an N-pole magnet and an S-pole magnet alternately arranged;
a bearing rotatably supporting the rotating shaft;
a bearing holder for receiving and fixing the bearing;
a stator having a penetration opening through which the bearing holder passes and having a coil pattern patterned on respective printed circuit board (PCB) layers of a multilayer PCB and connected via throughholes;
a sensing coil pattern formed on an uppermost PCB layer of the multilayer PCB to detect a rotor rotation position; and
a dead point prevention yoke for setting the sensing coil pattern to be positioned at a position deviated from a magnet interface of the rotor when the rotor is in an initial state.

18. The sensorless single-phase motor of claim 17, wherein the sensing coil pattern is disposed at a position deviated by a ¼ magnetic pole width from the interface of the magnetic poles or the center of the magnetic poles.

19. A cooling fan comprising:
- a rotor including a rotating shaft supported at a central portion thereof, a plurality of blades formed at an outer peripheral portion thereof, and N-pole magnets and S-pole magnets alternately arranged;
- a bearing rotatably supporting the rotating shaft;
- a bearing holder for receiving and fixing the bearing;
- a lower case for supporting the bearing holder;
- a stator having a penetration opening through which the bearing holder passes and having a coil pattern patterned on respective printed circuit board (PCB) layers of a multilayer PCB and connected via throughholes;
- a sensing coil pattern formed on an uppermost PCB layer of the multilayer PCB to detect a rotor rotation position;
- an upper case disposed opposite to the lower case; and
- side walls connecting the upper case and the lower case, wherein the lower case comprises:
- a ring portion formed at a center thereof with a penetration hole through which the bearing holder passes; and
- a plurality of bridges connecting the ring portion and a main body of the lower case,
- wherein the plurality of bridges are formed in the same number as the number of magnetic poles of the rotor or (the number of magnetic poles of the rotor/2), to have a dead point prevention yoke function.

20. The cooling fan of claim 19, wherein the coil pattern comprises:
- inner and outer rotating direction pattern portions which are arranged in a circumferential direction at intervals along an inner circumference and an outer circumference concentrically; and
- radial pattern portions that interconnect the inner rotating direction pattern portion and the outer rotating direction pattern portion that are adjacent to each other and that are disposed along the radial direction,
- wherein the rotor is formed in a ring shape, and the width of the ring is formed at least larger than the length of the radial direction pattern portion.

* * * * *